United States Patent
Harada et al.

(10) Patent No.: US 9,142,463 B2
(45) Date of Patent: Sep. 22, 2015

(54) SEMICONDUCTOR DEVICE

(75) Inventors: Yuichi Harada, Matsumoto (JP);
Tatsuya Naito, Matsumoto (JP);
Yoshiaki Toyoda, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 320 days.

(21) Appl. No.: 13/516,102

(22) PCT Filed: Jan. 28, 2011

(86) PCT No.: PCT/JP2011/051830
§ 371 (c)(1),
(2), (4) Date: Aug. 3, 2012

(87) PCT Pub. No.: WO2011/093472
PCT Pub. Date: Aug. 4, 2011

(65) Prior Publication Data
US 2012/0299108 A1   Nov. 29, 2012

(30) Foreign Application Priority Data
Jan. 29, 2010   (JP) ................. 2010-017682

(51) Int. Cl.
| H01L 23/62 | (2006.01) |
| H01L 21/84 | (2006.01) |
| H01L 27/02 | (2006.01) |
| H01L 27/06 | (2006.01) |
| H01L 27/12 | (2006.01) |
| H01L 29/739 | (2006.01) H01L 29/78 |
| (2006.01) | H01L 29/861 |
| (2006.01) | |

(52) U.S. Cl.
CPC ............ *H01L 21/84* (2013.01); *H01L 27/0255* (2013.01); *H01L 27/0259* (2013.01); *H01L 27/0629* (2013.01); *H01L 27/1203* (2013.01); *H01L 29/7395* (2013.01); *H01L 29/78* (2013.01); *H01L 29/861* (2013.01); *H01L 27/0635* (2013.01); *H01L 2224/48463* (2013.01); *H01L 2924/1305* (2013.01); *H01L 2924/13055* (2013.01); *H01L 2924/13091* (2013.01)

(58) Field of Classification Search
None
See application file for complete search history.

(56) References Cited

U.S. PATENT DOCUMENTS

| 4,492,974 A * | 1/1985 | Yoshida et al. ............... 257/328 |
| 5,763,926 A | 6/1998 | Yamamoto |
| 5,969,400 A | 10/1999 | Shinohe |

(Continued)

FOREIGN PATENT DOCUMENTS

| JP | 57-141962 A | 9/1982 |
| JP | 01-259570 A | 10/1989 |

(Continued)

OTHER PUBLICATIONS

International Search Report issued in PCT/JP2011/051830 dated May 10, 2011.

*Primary Examiner* — Yasser A Abdelaziez
(74) *Attorney, Agent, or Firm* — Rossi, Kimms & McDowell LLP

(57) ABSTRACT

By connecting a protection diode (71) wherein p-anode layers (21) and n-cathode layers (22) are alternately formed in a polysilicon layer, and p-n junctions (74) that are in a reverse blocking state when there is a forward bias are alternately short circuited with a metal film (53), to a power semiconductor element (IGBT (72)), it is possible to achieve a balance between a high breakdown capability and a smaller chip area, a rise of breakdown voltage is suppressed even when a clamping voltage is repeatedly applied, and furthermore, it is possible to prevent destruction caused by a negative surge voltage input into a gate terminal (G).

12 Claims, 21 Drawing Sheets

(56) References Cited

U.S. PATENT DOCUMENTS

| | | |
|---|---|---|
| 6,172,383 B1 | 1/2001 | Williams |
| 6,208,011 B1 | 3/2001 | Yasuda |
| 6,224,180 B1 | 5/2001 | Pham-Van-Diep |
| 6,385,028 B1 | 5/2002 | Kouno |
| 6,770,949 B1 | 8/2004 | Eltoukhy |
| 6,969,891 B1 | 11/2005 | Leroux |
| 2001/0010379 A1 | 8/2001 | Yoshida |
| 2004/0238893 A1 | 12/2004 | Tobisaka |
| 2006/0006459 A1* | 1/2006 | Yoshikawa .................. 257/330 |

FOREIGN PATENT DOCUMENTS

| | | |
|---|---|---|
| JP | 04-072667 A | 3/1992 |
| JP | 06-163911 A | 6/1994 |
| JP | 07-050304 A | 2/1995 |
| JP | 07-130898 A | 5/1995 |
| JP | 7-202191 A | 8/1995 |
| JP | 08-316480 A | 11/1996 |
| JP | 09-045905 B2 | 2/1997 |
| JP | 11-251443 A | 9/1999 |
| JP | 11-251594 A | 9/1999 |
| JP | 11-284175 A | 10/1999 |
| JP | 2000-077537 A | 3/2000 |
| JP | 2000-174272 A | 6/2000 |
| JP | 2002-141507 A1 | 5/2002 |
| JP | 2002-538598 A | 11/2002 |
| JP | 2004-327976 A | 11/2004 |
| JP | 2005-347771 A | 12/2005 |
| JP | 2006-019528 A | 1/2006 |

* cited by examiner

DISTANCE L BETWEEN p-n JUNCTION AND METAL FILM (μm)

NUMBER OF VOLTAGE CLAMPINGS

SEMICONDUCTOR DEVICE

This application is a U.S. National Phase Application of PCT International Application PCT/JP2011/051830, filed on Jan. 28, 2011, which is based on and claims priority from JP 2010-017682, filed on Jan. 29, 2010. The contents of the documents cited in this paragraph are hereby incorporated herein by reference in their entireties.

TECHNICAL FIELD

The present invention relates to a semiconductor device.

BACKGROUND ART

In recent years, a large number of semiconductor devices are mounted in automobiles. A high breakdown capability (high surge capability) with respect to various kinds of surge voltage, such as ESD (electro-static discharge) is required of these semiconductor devices. Because of this, a surge protection diode (hereafter called a protection diode) is connected in order to protect a power semiconductor element configuring a semiconductor device from surge voltage.

When an external surge voltage or noise voltage, a surge voltage generated by an operation of the power semiconductor element itself, or the like, is applied to the power semiconductor element, a high breakdown capability of the semiconductor device is realized by clamping excessive voltage with the protection diode so that the excessive voltage is not applied to the power semiconductor element.

FIG. 18 is a sectional view showing main portions of a semiconductor device having a heretofore known protection diode. As shown in FIG. 18, in a heretofore known semiconductor device 800, an n-semiconductor layer (hereafter referred to as a high concentration n-semiconductor layer) 2, with an impurity concentration higher than that of a p-semiconductor substrate 1, is disposed on the p-semiconductor substrate 1. An n-semiconductor layer (hereafter referred to as a low concentration n-semiconductor layer) 3, with an impurity concentration lower than that of the high concentration n-semiconductor layer 2, is disposed on the high concentration n-semiconductor layer 2. A p-well layer 34 is disposed in a region (hereafter referred to as a control circuit region) in which is formed a control circuit 91 in a surface layer of the low concentration n-semiconductor layer 3, and a p-well layer 4 is disposed in a region (hereafter referred to as an IGBT region) in which is formed an IGBT 92.

The control circuit region is disposed in a central portion of the low concentration n-semiconductor layer 3. The plural p-well layer 34 are disposed distanced from each other. A MOSFET, diode, resistor Rg (not shown), or the like, configuring the control circuit 91 is disposed in a surface layer of each p-well layer 34. The MOSFET and diode shown in FIG. 18 are each disposed in a different p-well layer 34. Specifically, an n-source layer 35a and an n-drain layer 35b are provided as a MOSFET in the surface layer of one p-well layer 34, while an n-cathode layer 35c is provided as a diode in the surface layer of another p-well layer 34.

A gate electrode 38 is disposed across a gate insulating film 37 on the p-well layer 34 sandwiched by the n-source layer 35a and n-drain layer 35b. A source electrode 54 is in contact with the n-source layer 35a. A drain electrode 55 is in contact with the n-drain layer 35b. Although not shown in the drawing, a MOSFET body diode (parasitic diode) is formed, connected to the source electrode 54, in the p-well layer 34 in which the MOSFET is provided. A cathode electrode 56 is in contact with the n-cathode layer 35c. An anode electrode 57 is in contact with the p-well layer 34 in which the n-cathode layer 35c is provided.

The IGBT region neighbors the control circuit region (on the right side in the plane of FIG. 18). An n-emitter layer 5 of the IGBT 92, which is a power semiconductor element, is disposed in a surface layer of the p-well layer 4. A gate electrode 10 is disposed across a gate insulating film 7 on the p-well layer 4 sandwiched by the n-emitter layer 5 and low concentration n-semiconductor layer 3. An emitter electrode 12 is in contact with the n-emitter layer 5 and the p-well layer 4. Also, a collector electrode 11 configuring the IGBT 92 is disposed on the rear surface of the p-semiconductor substrate 1, which forms a p-collector layer.

Furthermore, a region in which a protection diode 81 (hereafter referred to as a protection diode region) is formed is provided in the low concentration n-semiconductor layer 3 in a region neighboring the control circuit region. The protection diode region neighbors the control circuit region on the side opposite to the IGBT region (on the left side in the plane of FIG. 18), thereby sandwiching the control circuit region. In the protection diode region, an insulating film (LOCOS oxide film) is provided on the low concentration n-semiconductor layer 3.

The protection diode 81 configured of three single unidirectional diodes 81a—a first diode, a second diode, and a third diode—formed of a p-anode layer 21 and an n-cathode layer 22 is disposed on the insulating film 60. For example, the first diode is disposed in the region the farthest from the control circuit region (on the left side in the plane of FIG. 18), while the third diode is disposed in the region nearest to the control circuit region (on the right side in the plane of FIG. 18).

The protection diode 81 is formed of a multi-crystal silicon layer (polysilicon layer). A cathode electrode 51 of the protection diode 81 is in contact with the n-cathode layer 22 of the first diode. The cathode electrode 51 is connected to a gate terminal G of the semiconductor 800. The cathode electrode 51 is connected via the control circuit 91 to the gate electrode 10 of the IGBT 92. An anode electrode 52 is in contact with the p-anode layer 21 of the third diode. The anode electrode 52 is connected to the emitter electrode 12 of the IGBT 92.

That is, the protection diode 81 is inserted between the gate terminal G and the emitter electrode 12 of the IGBT 92. This is equivalent to inserting the protection diode 81 between the gate electrode 10 and emitter electrode 12 of the IGBT 92. Also, as the control circuit 91 is also connected to the protection diode 81, the control circuit 91 is protected from surge.

FIG. 19 is a plan view showing main portions of the protection diode of FIG. 18. The n-cathode layer 22 of the first diode (on the left side in the plane of FIG. 19) is connected via the cathode electrode 51 and a pad electrode to the gate terminal G. The p-anode layer 21 of the first diode is connected to the n-cathode layer 22 of the second diode (in the center in the plane of FIG. 19). The p-anode layer 21 of the second diode is connected to the n-cathode layer 22 of the third diode (on the right side in the plane of FIG. 19). The p-anode layer 21 of the third diode is connected via the anode electrode 52 to the emitter electrode 12 of the IGBT 92. The emitter electrode 12 is connected via the pad electrode to an emitter terminal E.

FIG. 20 is an equivalent circuit showing the semiconductor device of FIG. 18. The three unidirectional diodes 81a configuring the protection diode 81 are connected in series. Of the three unidirectional diodes 81a, the cathode of an upper stage unidirectional diode 81a is connected to the gate terminal G connected to the control circuit 91, while the anode of a lower stage unidirectional diode 81a is connected to the emitter of the IGBT 92. That is, the upper stage unidirectional diode 81a is the first diode of the protection diode 81, while the lower stage unidirectional diode 81a is the third diode of the protection diode 81.

As shown in FIGS. 18 to 20, in the semiconductor device 800, the protection diode 81 formed of a polysilicon layer is formed across the insulating film 60 (LOCOS oxide film) on a surface of the semiconductor (low concentration n-semiconductor layer 3), and the n-cathode layer 22 of the protection diode 81 is connected via the control circuit 91 to the gate electrode 10 of the IGBT 92. Then, the p-anode 21 of the protection diode 81 is connected via the emitter electrode 12 of the IGBT 92 to the n-emitter layer 5. When a surge voltage is applied to the gate terminal G, the protection diode 81 breaks down, clamping the surge voltage, and no high voltage is applied to the gate electrode 10 of the IGBT 92. As a result of this, the IGBT 92 is protected from surge voltage.

Also, in the semiconductor device 800, a breakdown voltage necessary as the protection diode 81 is obtained by the three unidirectional diodes 81a being connected in series. For example, although a gate input voltage is 5V at a time of normal operation in a vehicle mounted application, it may happen that a 12V battery voltage is mistakenly applied to the gate terminal when handling. In order to protect the protection diode 81 itself from this kind of mistaken input, a breakdown voltage equal to or greater than the battery voltage is necessary. Additionally, in order to protect the gate of the IGBT 92, it is necessary that a voltage applied to the gate of the IGBT 92 is equal to or less than the gate breakdown voltage. It is possible to adjust the breakdown voltage of the protection diode 81 by changing the number of the unidirectional diodes 81a. However, when the number of the unidirectional diodes 81a increases, the area of the region (protection diode region) in which the protection diode 81 is formed increases. That is, the chip area of the semiconductor device 800 increases.

Therefore, a description will be given of a method of reducing the area of the protection diode 81. FIG. 21 is a plan view showing main portions of another example of a heretofore known protection diode. FIG. 21 shows a protection diode 82, which realizes a smaller area in comparison with FIGS. 18 and 19. The protection diode 82 is configured of multi-stage unidirectional diodes 81a formed of a polysilicon layer in which plural p-anode layers 21 and n-cathode layers 22 are alternately disposed. Neighboring unidirectional diodes 81a are connected. That is, the protection diode 82 configured of the multi-stage unidirectional diodes 81a is of a configuration wherein the p-anode layers 21 and n-cathode layers 22 of the unidirectional diodes 81a are alternately disposed, neighboring p-anode layers 21 and n-cathode layers 22 are connected, and plural bidirectional diodes having breakdown voltage in two directions are connected in series.

FIG. 22 is a wiring diagram showing a connection relationship between the heretofore known protection diode and a control circuit. The protection diode 82 is inserted between the gate terminal G and the emitter electrode 12 (emitter terminal E) of the IGBT 92, and no current arises until the bidirectional diodes break down in both the forward and reverse directions.

Next, a description will be given of an example wherein a protection diode 83 is inserted between the collector and gate of the IGBT, protecting the semiconductor device from surge voltage. FIG. 23 is an explanatory diagram showing main portions of another example of a semiconductor device having a heretofore known protection diode. FIG. 23 is an explanatory diagram showing a configuration of a semiconductor device in which is mounted the protection diode 83, which is formed of bidirectional diodes. FIG. 23(a) is a plan layout diagram of the whole of the semiconductor device shown in FIG. 23. FIG. 23(b) is a sectional view showing main portions of the semiconductor device shown in FIG. 23. FIG. 23(c) is a plan view showing main portions of the protection diode 83. FIG. 24 is an equivalent circuit diagram showing the semiconductor device of FIG. 23. As shown in FIG. 23, in a semiconductor device 900, the cathode electrode 51 of the protection diode 83 is connected to a collector terminal C via a stopper layer 85 of the IGBT 92, the p-semiconductor substrate 1 that forms a collector layer, and the collector electrode 11. The anode electrode 52 of the protection diode 83 is connected to the gate electrode 10 of the IGBT 92. The stopper layer 85 has the same potential as the collector layer.

As shown in FIG. 23(b), in the semiconductor device 900, for example, an IGBT region is provided between a control circuit region and a protection diode region. The configurations of the control circuit 91 and IGBT 92 are the same as in FIG. 18.

When a high voltage, such as an external surge voltage or a turn-off voltage when the IGBT 92 is switching, is applied to the collector terminal C, the protection diode 83 breaks down before the IGBT 92. Because of the breakdown, a current flows from the collector of the IGBT 92 via the protection diode 83 to the resistor Rg (refer to FIG. 22) in the control circuit 91, and a voltage is generated in the resistor Rg. The voltage is applied to the gate of the IGBT 92, the gate potential of the IGBT 92 rises, and when the gate potential rises to or above the gate threshold value, the IGBT 92 carries out a turning-on operation. As a result of the turning-on operation, no high voltage of a certain value or more is applied to the collector of the IGBT 92.

Also, the protection diode 83, in the same way as the protection diode 82 shown in FIG. 21, is configured of bidirectional diodes formed of a polysilicon layer formed on the insulating film 60. As the p-anode layers 21 and n-cathode layers 23 of the bidirectional diodes are all of a high impurity concentration, the bidirectional diodes are bidirectional Zener diodes. The protection diode 83 is formed by, for example, vapor phase diffusion.

Also, in, for example, Patent Document 1 below, there is proposed a semiconductor device wherein a protection diode is formed of bidirectional Zener diodes. In Patent Document 1 below, the bidirectional Zener diodes are configured of high impurity concentration p-anode layers and n-cathode layers with an impurity concentration lower than that of the p-anode layers.

RELATED ART DOCUMENTS

Patent Documents

Patent Document 1: JP-A-11-251443

OUTLINE OF THE INVENTION

Problems to be Solved by the Invention

A summary of the heretofore described details is as follows.

(1) In order to maintain the breakdown voltage and high breakdown capability of the protection diodes 81 and 83, it is necessary to increase the junction area of the single unidirectional diodes 81a configuring the protection diodes 81 and 83, and increase the number of unidirectional diodes 81a. However, the area of the protection diodes 81 and 83 increases, and the chip area increases.

(2) When the impurity concentration of the p-anode layers 21 and n-cathode layers 22 and 23 is high, the breakdown voltage of the unidirectional diodes 81a decreases. In order to maintain a breakdown voltage necessary as the protection diodes 81 and 83, it is necessary to increase the number of unidirectional diodes 81a. However, when increasing the number of unidirectional diodes 81a, the area of the protection diodes 81 and 83 increases, and the chip area increases. Furthermore, when the p-anode layers 21 and n-cathode layers 22 and 23 are formed by vapor phase diffusion, the area of the p-anode layers 21 and n-cathode layers 22 and 23 increases, the area of the protection diodes 81 and 83 increases, and the chip area increases.

(3) When attempting to maintain a desired breakdown voltage of the protection diodes 81 and 83 by lowering the impurity concentration of the p-anode layers 21 or n-cathode layers 22 and 23 of the single unidirectional diodes 81a, thus increasing the breakdown voltage, and by reducing the number of unidirectional diodes 81a, the breakdown voltage of the protection diodes 81 and 83 rises when a clamping voltage is repeatedly applied, as shown in FIG. 12, and the protection function of the protection diodes 81 and 83 is lost.

(4) When adopting the protection diode 83 configured of bidirectional diodes in order to reduce the area of the protection diode, the body diode (parasitic diode) of the MOSFET configuring the control circuit 91 is biased in a forward direction when a negative surge voltage is applied to the gate terminal G, a large current flows toward the gate terminal G, and the MOSFET is destroyed. Because of this, when connecting the cathode of the protection diode 83 configured of bidirectional diodes to the gate terminal G, it is not possible to protect the semiconductor device from negative surge voltage.

Also, there is no description in Patent Document 1 of a protection diode wherein the bidirectional diodes are converted to unidirectional diodes by alternately short circuiting p-n junctions with a metal film. Also, there is no description of a four layer structure of a p-high concentration layer, a p-low concentration layer, an n-medium concentration layer, and an n-high concentration layer. Furthermore, there is no description of a measure for preventing a rise in protection diode breakdown voltage caused by a repeated clamping voltage. Of the plural unidirectional diodes configuring the protection diode, the low concentration layer has an impurity concentration lower than that of the other unidirectional diodes. The medium concentration layer has an impurity concentration higher than that of the low concentration layer, and lower than that of the high concentration layer.

The invention, in order to solve the problems of the heretofore described heretofore known technology, has an object of providing a semiconductor device wherein balance is achieved between high breakdown capability and a smaller chip area. Also, the invention has an object of providing a semiconductor device wherein it is possible to suppress a rise in breakdown voltage, even when a clamping voltage is repeatedly applied. Also, the invention has an object of providing a semiconductor device wherein it is possible to prevent destruction caused by a negative surge voltage input into the gate terminal.

Means for Solving the Problems

In order to solve the heretofore described problems, thereby achieving the objects of the invention, a semiconductor device according to a first aspect of the invention is characterized by including at least a semiconductor element, and a protection diode formed across an insulating film on a semiconductor substrate on which the semiconductor element is formed, wherein the protection diode is configured of plural unidirectional diodes wherein plural n-type semiconductor layers and p-type semiconductor layers are alternately disposed in contact, and p-n junctions formed of the n-type semiconductor layers and p-type semiconductor layers are alternately short circuited by a conductive film, a cathode electrode of the protection diode is connected to a gate electrode of the semiconductor element, and an anode electrode of the protection diode is connected to a low potential side main electrode (an emitter electrode in the case of an IGBT, and a source electrode in the case of an n-channel MOSFET) of the semiconductor element.

Also, in order to solve the problems of the heretofore described heretofore known technology, a semiconductor device according to a second aspect of the invention is characterized by including at least a semiconductor element, and a protection diode formed across an insulating film on a semiconductor substrate on which the semiconductor element is formed, wherein the protection diode is configured of plural unidirectional diodes wherein plural n-type semiconductor layers and p-type semiconductor layers are alternately disposed in contact, and p-n junctions formed of the n-type semiconductor layers and p-type semiconductor layers are alternately short circuited by a conductive film, a cathode electrode of the protection diode is connected to a high potential side main electrode (a collector electrode in the case of an IGBT, and a drain electrode in the case of an n-channel MOSFET) of the semiconductor element, and an anode electrode of the protection diode is connected to a gate electrode of the semiconductor element. Herein, the alternately short circuited p-n junctions are junctions that are in a reverse blocking state when there is a forward bias.

Also, a semiconductor device according to another aspect of the invention is characterized in that, the cathode electrode or anode electrode of the protection diode is connected to the gate electrode of the semiconductor element via a control circuit formed on the semiconductor substrate.

Also, a semiconductor device according to another aspect of the invention is characterized in that, the impurity concentration of the n-type semiconductor layer is lower than the impurity concentration of the p-type semiconductor layer, and the impurity dose of the n-type semiconductor layer is $1 \times 10^{13}$ cm$^{-2}$ or more, $5 \times 10^{14}$ cm$^{-2}$ or less.

Also, a semiconductor device according to another aspect of the invention is characterized in that, the distance between the p-n junction of the protection diode and the conductive film on the n-type semiconductor layer is 1.5 μm or more, 4.0 μm or less.

Also, a semiconductor device according to another aspect of the invention is characterized in that, the n-type semiconductor layer in contact with the cathode electrode of the protection diode is formed of a low concentration layer and a high concentration layer, and the impurity dose of the low concentration layer n-type semiconductor layer being $1 \times 10^{13}$ cm$^{-2}$ or more, $5 \times 10^{14}$ cm$^{-2}$ or less, the impurity dose of the high concentration layer is higher than the impurity dose of the low concentration layer.

Also, a semiconductor device according to another aspect of the invention is characterized in that, plural each of the cathode electrode of the protection diode and the n-type semiconductor layer in contact with the cathode electrode is formed.

Also, a semiconductor device according to another aspect of the invention is characterized in that, the plan form of the p-n junction short circuited with the conductive film is a form wherein the n-type semiconductor layer and p-type semiconductor layer fit together in an irregular form.

Also, in order to solve the problems of the heretofore described heretofore known technology, a semiconductor device according to another aspect of the invention is characterized by including at least a semiconductor element, and a protection diode formed across an insulating film on a semiconductor substrate on which the semiconductor element is formed, wherein a cathode electrode of the protection diode is connected to a gate electrode of the semiconductor element, an anode electrode of the protection diode is connected to a low potential side main electrode of the semiconductor element, the protection diode is configured of four layers of unidirectional diode formed in contact in the order of a high concentration first conductivity type semiconductor layer, a medium concentration first conductivity type semiconductor layer, a low concentration second conductivity type semiconductor layer, and a high concentration second conductivity type semiconductor layer, and the width of the low concentration second conductivity type semiconductor layer is a width such that a depletion layer reaches through at a clamping voltage. Herein, of the plural semiconductor layers configuring the protection diode, one whose impurity concentration is lower than that of the other semiconductor layers is taken to be of a low concentration, while those whose impurity concentration is higher than that of the low concentration semiconductor layer are taken to be of a medium concentration or high concentration. The medium concentration semiconductor layer has an impurity concentration lower than that of the high concentration semiconductor layers (hereafter, the same also applies to the other claims).

Also, in order to solve the problems of the heretofore described heretofore known technology, a semiconductor device according to another aspect of the invention is characterized by including at least a semiconductor element, and a protection diode formed across an insulating film on a semiconductor substrate on which the semiconductor element is formed, wherein a cathode electrode of the protection diode is connected to a high potential side main electrode of the semiconductor element, an anode electrode of the protection diode is connected to a gate electrode of the semiconductor element, the protection diode is configured of four layers of unidirectional diode formed in contact in the order of a high concentration first conductivity type semiconductor layer, a medium concentration first conductivity type semiconductor layer, a low concentration second conductivity type semiconductor layer, and a high concentration second conductivity type semiconductor layer, and the width of the low concentration second conductivity type semiconductor layer is a width such that a reach-through of a depletion layer occurs at a clamping voltage.

Also, a semiconductor device according to another aspect of the invention is characterized in that, the cathode electrode or anode electrode of the protection diode is connected to the gate electrode of the semiconductor element via a control circuit formed on the semiconductor substrate.

Also, a semiconductor device according to another aspect of the invention is characterized in that, the protection diode is a multi-stage unidirectional diode formed of the four layers of unidirectional diode connected in series in a forward direction.

Also, in order to solve the problems of the heretofore described heretofore known technology, a semiconductor device according to another aspect of the invention is characterized by including at least a semiconductor element, and a protection diode formed across an insulating film on a semiconductor substrate on which the semiconductor element is formed, wherein one main electrode of the protection diode is connected to a low potential side main electrode of the semiconductor element, the other main electrode of the protection diode is connected to a gate electrode of the semiconductor element, the protection diode is configured of seven layers of bidirectional diode formed in contact in the order of a high concentration first conductivity type semiconductor layer, a medium concentration first conductivity type semiconductor layer, a low concentration second conductivity type semiconductor layer, a high concentration second conductivity type semiconductor layer, a low concentration second conductivity type semiconductor layer, a medium concentration first conductivity type semiconductor layer, and a high concentration first conductivity type semiconductor layer, and the width of the low concentration second conductivity type semiconductor layer is a width such that a reach-through of a depletion layer occurs at a clamping voltage.

Also, in order to solve the problems of the heretofore described heretofore known technology, a semiconductor device according to another aspect of the invention is characterized by including at least a semiconductor element, and a protection diode formed across an insulating film on a semiconductor substrate on which the semiconductor element is formed, wherein one main electrode of the protection diode is connected to a high potential side main electrode of the semiconductor element, the other main electrode of the protection diode is connected to a gate electrode of the semiconductor element, the protection diode is configured of seven layers of bidirectional diode formed in contact in the order of a high concentration first conductivity type semiconductor layer, a medium concentration first conductivity type semiconductor layer, a low concentration second conductivity type semiconductor layer, a high concentration second conductivity type semiconductor layer, a low concentration second conductivity type semiconductor layer, a medium concentration first conductivity type semiconductor layer, and a high concentration first conductivity type semiconductor layer, and the width of the low concentration second conductivity type semiconductor layer is a width such that a reach-through of a depletion layer occurs at a clamping voltage.

Also, a semiconductor device according to another aspect of the invention is characterized in that, the other main electrode of the protection diode is connected to the gate electrode of the semiconductor element via a control circuit formed on the semiconductor substrate.

Also, a semiconductor device according to another aspect of the invention is characterized in that, the protection diode is formed of a multi-stage bidirectional diode formed of the seven layers of bidirectional diode connected in series.

Also, a semiconductor device according to another aspect of the invention is characterized in that, a main electrode in a place in which the seven layers of bidirectional diode are connected in series is removed.

Also, a semiconductor device according to another aspect of the invention is characterized in that, the protection diode is formed of a polysilicon layer or a single crystal silicon layer.

Also, a semiconductor device according to another aspect of the invention is characterized in that, when the low concentration second conductivity type semiconductor layer of the protection diode is formed of a low concentration p-type semiconductor layer, the width of the low concentration p-type semiconductor layer is 2 μm or less.

Also, a semiconductor device according to another aspect of the invention is characterized in that, the semiconductor element is an IGBT (insulated gate bipolar transistor) or MOSFET (MOS drive field effect transistor), which are power MOS-type elements.

According to the invention, by connecting a protection diode wherein p-anode layers and n-cathode layers are alternately formed, and p-n junctions that are in a reverse blocking state when there is a forward bias are alternately short circuited with a conductive film (metal film), to a semiconductor element, it is possible to provide a semiconductor device that has a high breakdown capability with respect to a surge voltage, and that has a small chip area. Also, it is possible to maintain a high breakdown capability with respect to a negative surge voltage input into the gate terminal of the semiconductor device.

Also, by the impurity concentration of the n-cathode layer being lower than the impurity concentration of the p-anode layer, and the impurity concentration of the n-cathode layer being a dose of $1.0\times10^{13}$ cm$^{-2}$ or more, $5.0\times10^{14}$ cm$^{-2}$ or less, it is possible to suppress the rise of the breakdown voltage of the protection diode, even when the clamping voltage is repeatedly applied.

Also, by the width of the n-cathode layer being 1.5 μm or more, it is possible to suppress the rise of the breakdown voltage of the protection diode, even when the clamping voltage is repeatedly applied. Also, by the width of the n-cathode layer being 4.0 μm or less, it is possible to keep the operating resistance low.

Also, an ohmic contact is obtained by the n-cathode layer in contact with the cathode electrode of the protection diode being formed as a high concentration layer, and the high concentration layer being higher than $1.0\times10^{13}$ cm$^{-2}$ or more, $5.0\times10^{14}$ cm$^{-2}$ or less, which is the impurity dose of the low concentration layer. Also, by forming the plural cathode electrodes and n-cathode layers in contact, and selecting the cathode electrode from among the plural cathode electrodes, it is possible to change and adjust the breakdown voltage of the protection diode.

Also, by arranging so that the impurity concentration of the p-anode layer is lower than the impurity concentration of the n-cathode layer, the width of the p-anode layer is less than the length of the extension of the depletion layer when the clamping voltage is applied, and the depletion layer is in a reach-through condition, it is possible to maintain the protection diode at a constant voltage, even when the clamping voltage is repeatedly applied.

Also, by configuring the n-cathode layer of a first n-layer (the medium concentration first conductivity type semiconductor layer), which has an impurity concentration higher than that of a p-anode layer (the low concentration second conductivity type semiconductor layer), and a second n-layer (the high concentration first conductivity type semiconductor layer) higher still than the first n-layer, and by the width of the p-anode layer being 2 μm or less, the depletion layer reaches through when the clamping voltage is repeatedly applied, and the breakdown voltage of the protection diode is constant, when the impurity concentration of the p-anode layer is low. Meanwhile, when the impurity concentration of the p-anode layer is a high impurity concentration such that no reach through occurs, the breakdown voltage of the protection diode does not in any case rise when the clamping voltage is repeatedly applied. That is, by the width of the p-anode layer being 2 μm or less, it is possible to suppress the rise of the breakdown voltage of the protection diode when the clamping voltage is repeatedly applied. Furthermore, by the first n-layer being provided, the depletion layer spreading in the first n-layer extends farther in comparison with a case in which the first n-layer is not provided, meaning that it is possible to achieve a higher breakdown voltage.

Advantage of the Invention

According to the semiconductor device according to the invention, an advantage is obtained in that it is possible to achieve a balance between high breakdown capability and a smaller chip area. Also, an advantage is obtained in that it is possible to suppress a rise in breakdown voltage, even when a clamping voltage is repeatedly applied. Also, an advantage is obtained in that it is possible to prevent destruction caused by a negative surge voltage input into the gate terminal.

MODE FOR CARRYING OUT THE INVENTION

Figure 1:
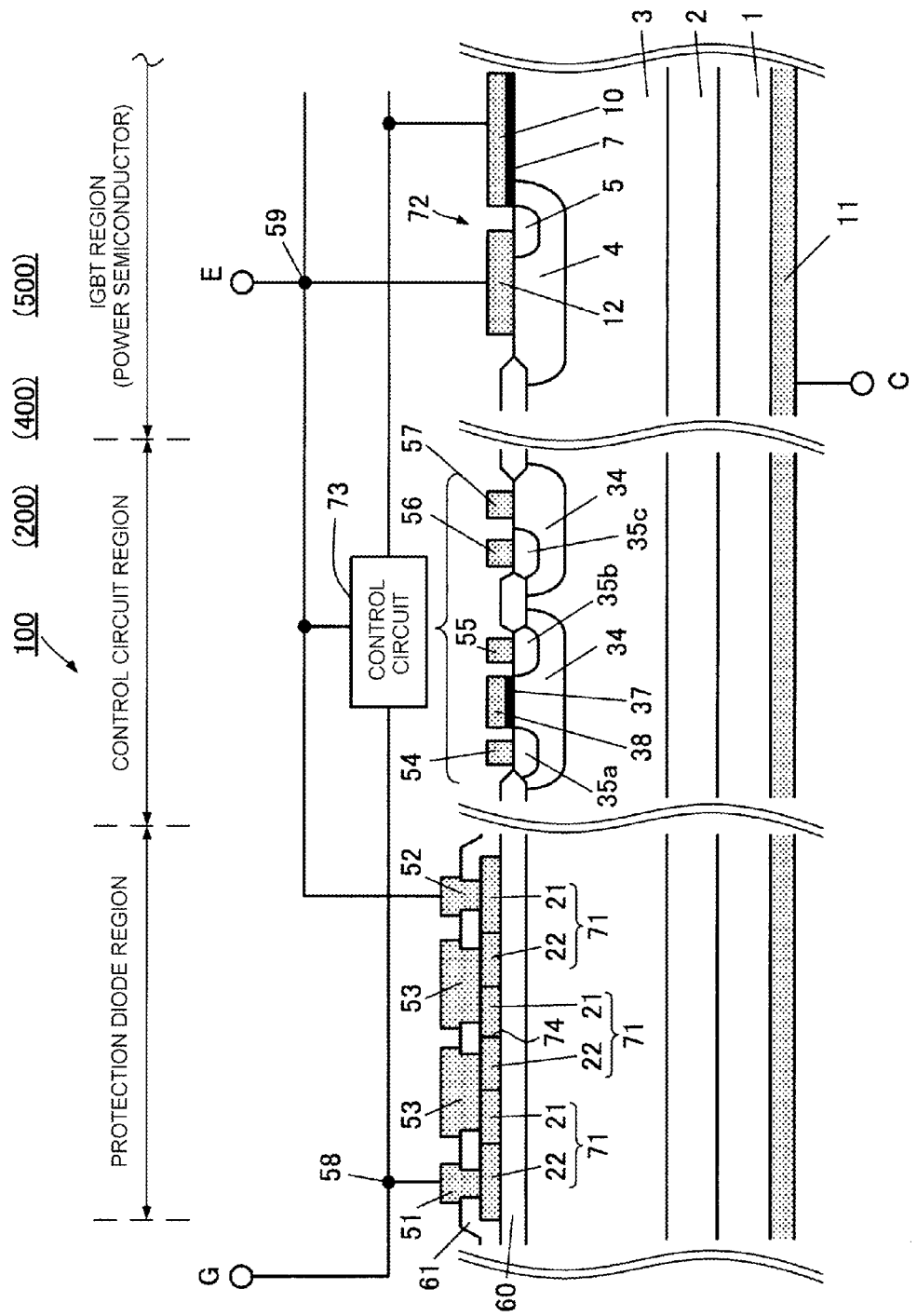
FIG. 1 is a sectional view showing main portions of a semiconductor device according to Embodiment 1.

Hereafter, referring to the attached drawings, a detailed description will be given of preferred embodiments of an adsorption mechanism according to the invention. The same reference numerals and signs are given to identical configurations in the following description of the embodiments and in the attached drawings, and a redundant description thereof is omitted. In the following description, p indicates that a conductivity type is p-type, and n indicates that a conductivity type is n-type. Also, the same reference numerals and signs are given to regions the same as in a heretofore known structure.

Embodiment 1

Figure 2:
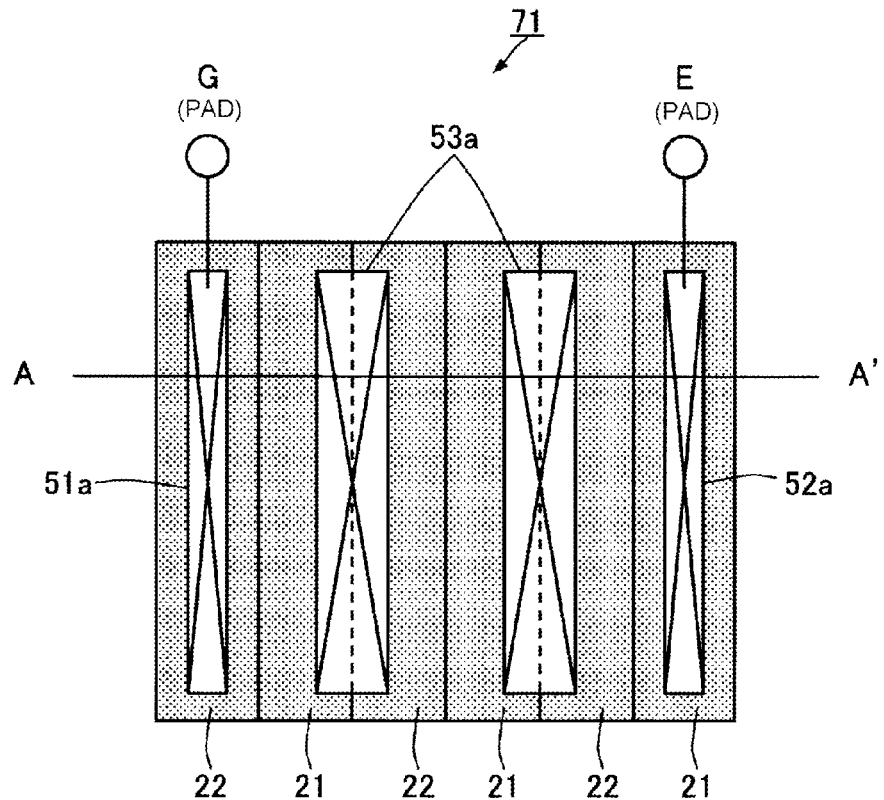
FIG. 2 is an explanatory diagram showing main portions of a protection diode of FIG. 1.
Figure 2:
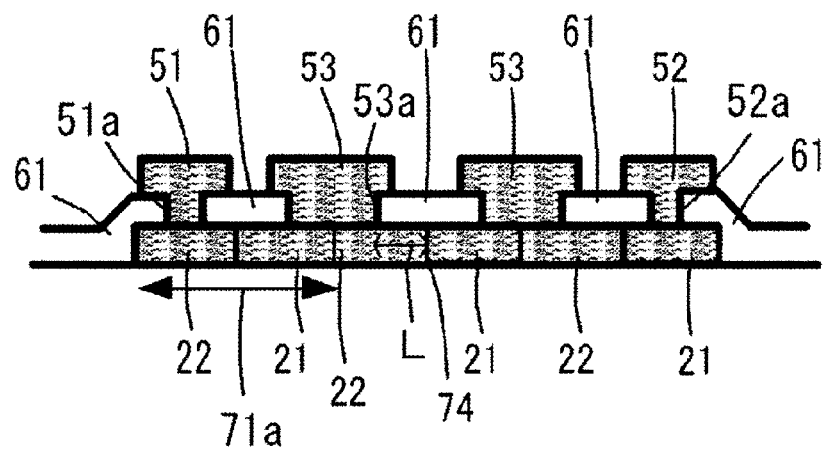
Figure 3:
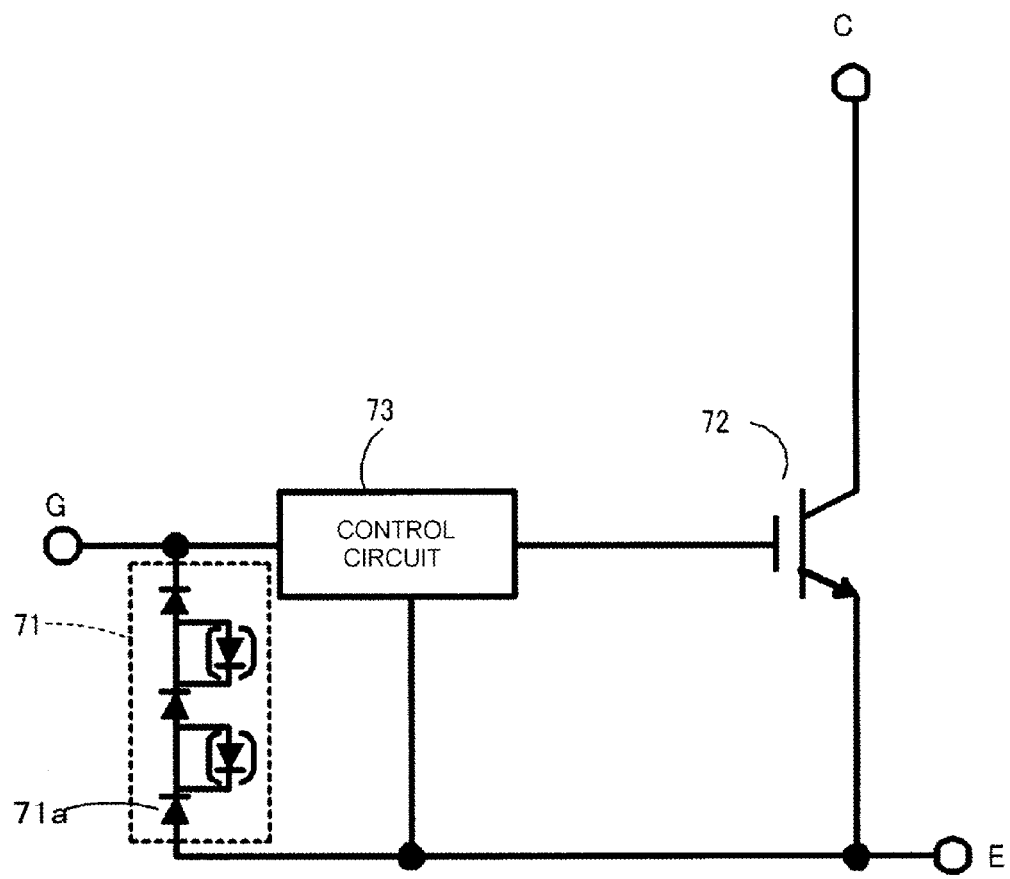
FIG. 3 is an equivalent circuit diagram showing the semiconductor device of FIG. 1.
Figure 4:
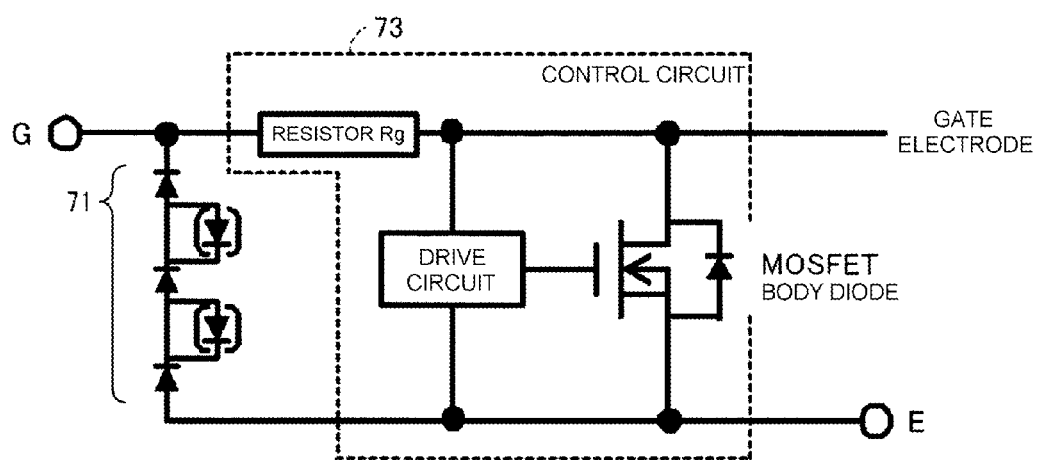
FIG. 4 is a wiring diagram showing a connection relationship between the protection diode of FIG. 1 and a control circuit.

FIG. 1 is an explanatory diagram showing main portions of a semiconductor device according to Embodiment 1. Also, FIG. 2 is a plan view showing main portions of a protection diode of FIG. 1. FIG. 2(a) is a plan view showing main portions of a protection diode 71. FIG. 2(b) is a sectional view along a section line A-A' of FIG. 2(a). Also, FIG. 3 is an equivalent circuit diagram showing the semiconductor device of FIG. 1. Also, FIG. 4 is a wiring diagram showing a connection relationship between the protection diode of FIG. 1 and a control circuit. As shown in FIG. 1, a semiconductor device 100 is configured of a region (IGBT region) in which is formed a vertical or lateral IGBT 72, which forms an output stage, on a surface of a low concentration n-semiconductor layer 3, a region (control circuit region) in which is formed a control circuit 73, wherein plural devices such as a lateral MOSFET, diode, and resistor that drive the IGBT 72 are formed and each subjected to a predetermined wire connection, and a region (protection diode region) in which the protection diode 71 is formed. The control circuit region is disposed in, for example, a central portion of the low concentration n-semiconductor layer 3. The IGBT region neighbors the control circuit region (on the right side in the plane of FIG. 1). The protection diode region neighbors the control circuit region on the side opposite to the IGBT region (on the left side in the plane of FIG. 1), sandwiching the control circuit region.

In the semiconductor device 100 shown in FIG. 1, the low concentration n-semiconductor layer 3 is disposed on a high concentration n-semiconductor layer 2. The low concentration n-semiconductor layer 3 has an impurity concentration lower than that of the high concentration n-semiconductor layer 2. The high concentration n-semiconductor layer 2 is disposed on a p-semiconductor substrate 1. The high concentration n-semiconductor layer 2 has an impurity concentration higher than that of the p-semiconductor substrate 1. In the control circuit region, plural p-well layers 34 are disposed in a surface layer of the low concentration n-semiconductor layer 3. The plural p-well layers 34 are disposed with being separated from each other. A MOSFET, diode, resistor Rg (not shown), or the like, configuring the control circuit 73 is disposed in a surface layer of each p-well layer 34. The MOSFET and diode shown in FIG. 1 are each disposed in a different p-well layer 34. Specifically, an n-source layer 35a and an n-drain layer 35b are provided as a MOSFET in the surface layer of one p-well layer 34, while an n-cathode layer 35c is provided as a diode in the surface layer of another p-well layer 34.

A gate electrode 38 is disposed across a gate insulating film 37 on the p-well layer 34 sandwiched by the n-source layer 35a and n-drain layer 35b. A source electrode 54 is in contact with the n-source layer 35a. A drain electrode 55 is in contact with the n-drain layer 35b. Although not shown in the drawing, a MOSFET body diode (parasitic diode) is formed, connected to the source electrode 54, in the p-well layer 34 in which the MOSFET is provided. A cathode electrode 56 is in contact with the n-cathode layer 35c. An anode electrode 57 is in contact with the p-well layer 34 in which the n-cathode layer 35c is provided.

In the IGBT region, a p-well layer 4 is disposed in the surface layer of the low concentration n-semiconductor layer 3. An n-emitter layer 5 of the IGBT 72, which is a power semiconductor element, is disposed in a surface layer of the p-well layer 4. A gate electrode 10 is disposed across a gate insulating film 7 on the p-well layer 4 sandwiched by the n-emitter layer 5 and low concentration n-semiconductor layer 3. An emitter electrode 12 is in contact with the n-emitter layer 5 and the top of the p-well layer 4. Also, a collector electrode 11 configuring the IGBT 72 is disposed on the rear surface of the p-semiconductor substrate 1, which forms a p-collector layer.

In the protection diode region, an insulating film 60 (LOCOS oxide film) is formed on the low concentration n-semiconductor layer 3. The protection diode 71, formed of a polysilicon layer wherein p-anode layers 21 and n-cathode layers 22 are alternately disposed, is disposed on the insulating film 60. That is, p-n junctions 74 are formed of the p-anode layers 21 and n-cathode layers 22 of the protection diode 71. An interlayer insulating film 61 is provided on the p-anode layers 21 and n-cathode layers 22 of the protection diode 71.

As shown in FIG. 2, a contact hole 51a, a contact hole 52a, and contact holes 53a are formed in the interlayer insulating film 61. The contact hole 51a selectively exposes the n-cathode layer 22 distanced the farthest from the control circuit region. The contact hole 52a selectively exposes the p-anode layer 21 the nearest to the control circuit region. The contact holes 53a alternately selectively expose the p-anode layer 21 and n-cathode layer 22 in the vicinity of the p-n junction 74.

The p-anode layer 21 and n-cathode layer 22 exposed in the contact holes 53a are short circuited by a metal film (conductive film) 53. The n-cathode layer 22 exposed in the contact hole 51a is connected to a cathode electrode 51. The p-anode layer 21 exposed in the contact hole 52a is connected to an anode electrode 52. By alternately short circuiting the p-n junctions 74, which are in a reverse blocking state when there is a forward bias, with the metal film 53, the protection diode 71 is converted from series connected bidirectional diodes to series connected unidirectional diodes 71a.

Figure 19:
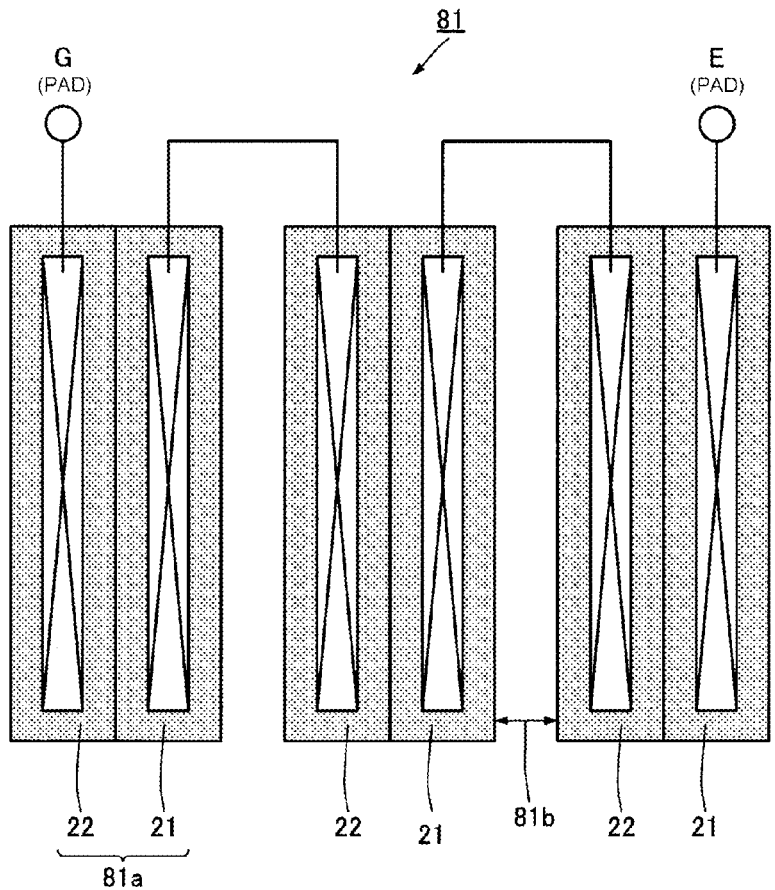
FIG. 19 is a plan view showing main portions of the protection diode of FIG. 18.
Figure 20:
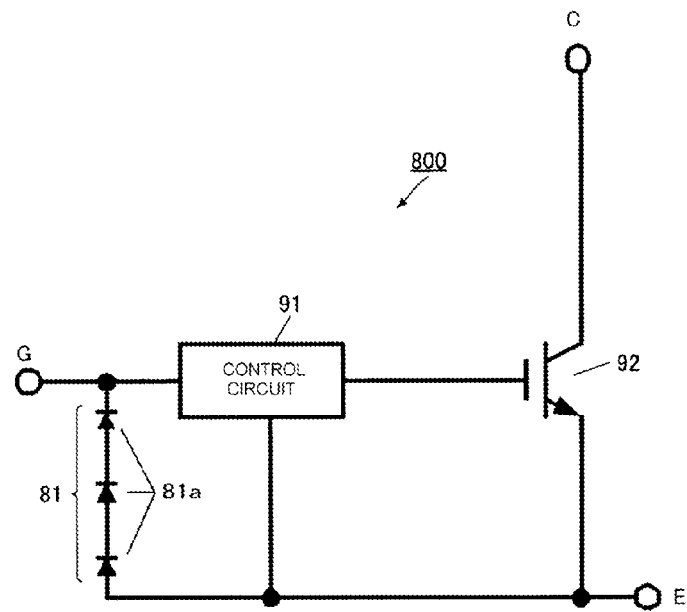
FIG. 20 is an equivalent circuit diagram showing the semiconductor device of FIG. 18.
Figure 21:
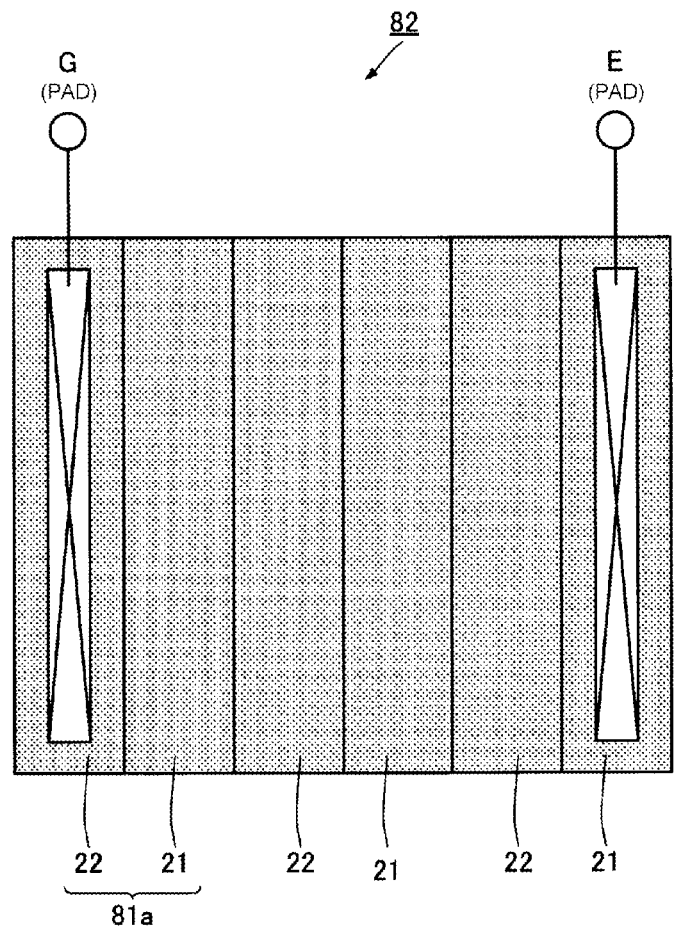
FIG. 21 is a plan view showing main portions of another example of a heretofore known protection diode.
Figure 22:
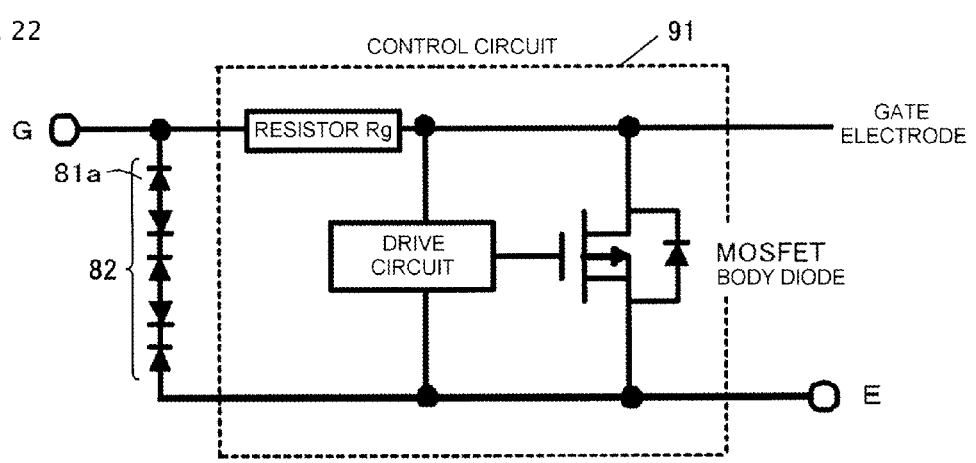
FIG. 22 is a wiring diagram showing a connection relationship between the heretofore known protection diode and a control circuit.
Figure 23:
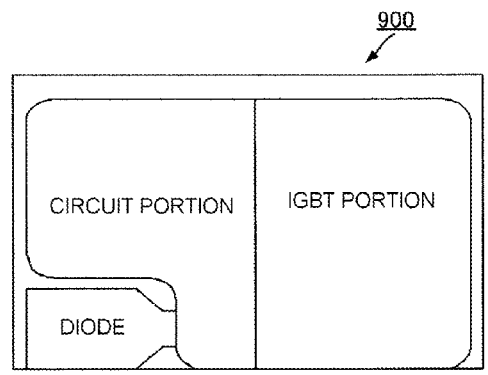
FIG. 23 is an explanatory diagram showing main portions of another example of a semiconductor device having a heretofore known protection diode.
Figure 23:
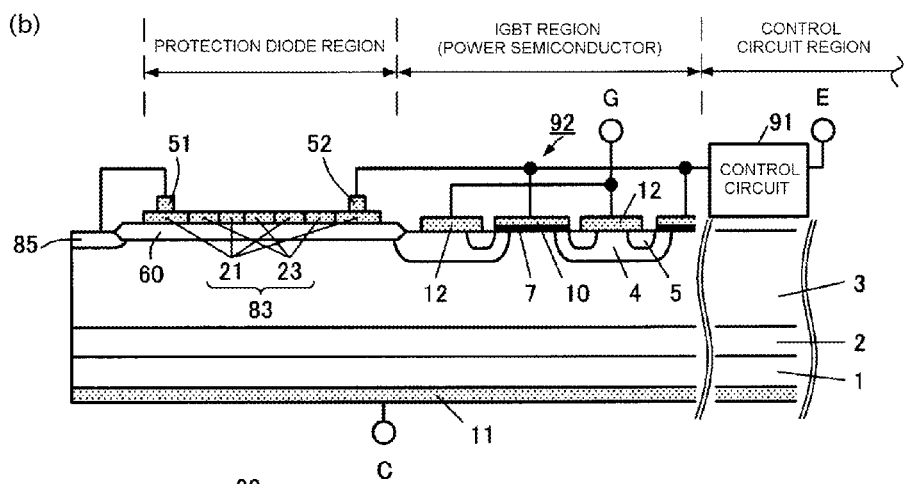
Figure 23:
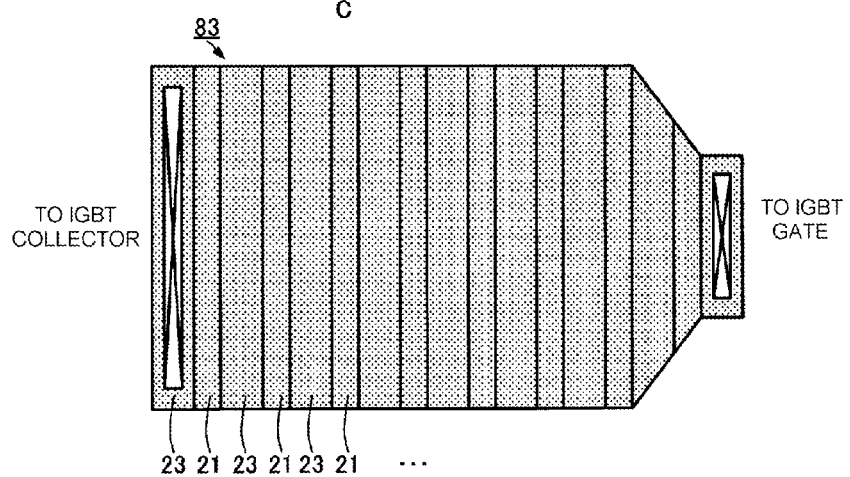
Figure 24:
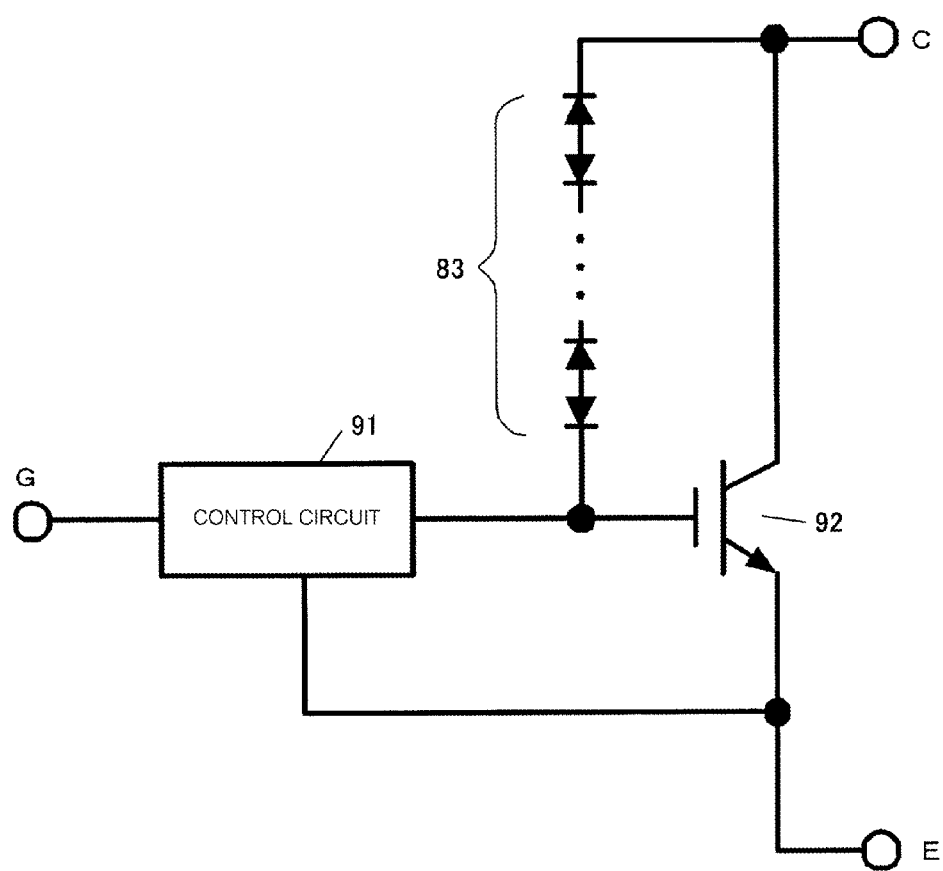
FIG. 24 is an equivalent circuit diagram showing the semiconductor device of FIG. 23.

By causing the plural unidirectional diode 71a formed from a polysilicon layer in this way to come into contact, the area of the protection diode 71 is smaller in comparison with a heretofore known protection diode 81 (refer to FIG. 19) wherein single unidirectional diodes 81a are connected in series. The reason for this is that when unidirectional diodes 81a are connected in series, as in the protection diode 81, a gap 81b (refer to FIG. 19) forms between adjacent unidirectional diodes 81a. Because of this, it is possible with the protection diode 71 to make the chip area smaller than that heretofore known.

Also, as shown in FIG. 1, a gate terminal G of the semiconductor device 100 is connected via the control circuit 73 to the gate electrode 10 of the IGBT 72. The cathode electrode 51 of the protection diode 71 is connected via a pad electrode 58 to the gate terminal G of the semiconductor device 100. Furthermore, the cathode electrode 51 of the protection diode 71 is connected via the control circuit 73 to the gate electrode 10 of the IGBT 72. The anode electrode 52 of the protection diode 71 is connected via a pad electrode 59 to the emitter electrode 12 of the IGBT 72.

That is, the protection diode 71 is inserted between the gate terminal G and the emitter electrode 10 of the IGBT 72. Because of this, the control circuit 73 and the gate of the IGBT 72 are protected by the protection diode 71 from a surge voltage. The protection diode 71 is such that, by changing the number of repetitions of the p-anode layer 21 and n-cathode layer 22, it is possible to carry out a change and adjustment of the breakdown voltage of the protection diode 71.

Also, by using the protection diode 71 in the surge protection of the IGBT 72, it is possible to provide a semiconductor device 100 that achieves a high breakdown capability and a smaller chip area. When using the protection diode 71, it does not happen that an excessive current flows through the body diode (parasitic diode), even when a negative surge is applied to the gate terminal G. Because of this, the MOSFET of the control circuit 73 is protected from a surge.

In the above description, a description has been given of a case wherein the protection diode 71 is connected to the gate and emitter of the IGBT 72, but the protection diode 71 may also be connected to the gate and collector of the IGBT 72. In this case too, it is possible to protect the IGBT 72 from a surge, and it is possible to obtain a semiconductor device 100 that has a high breakdown capability.

Figure 5:
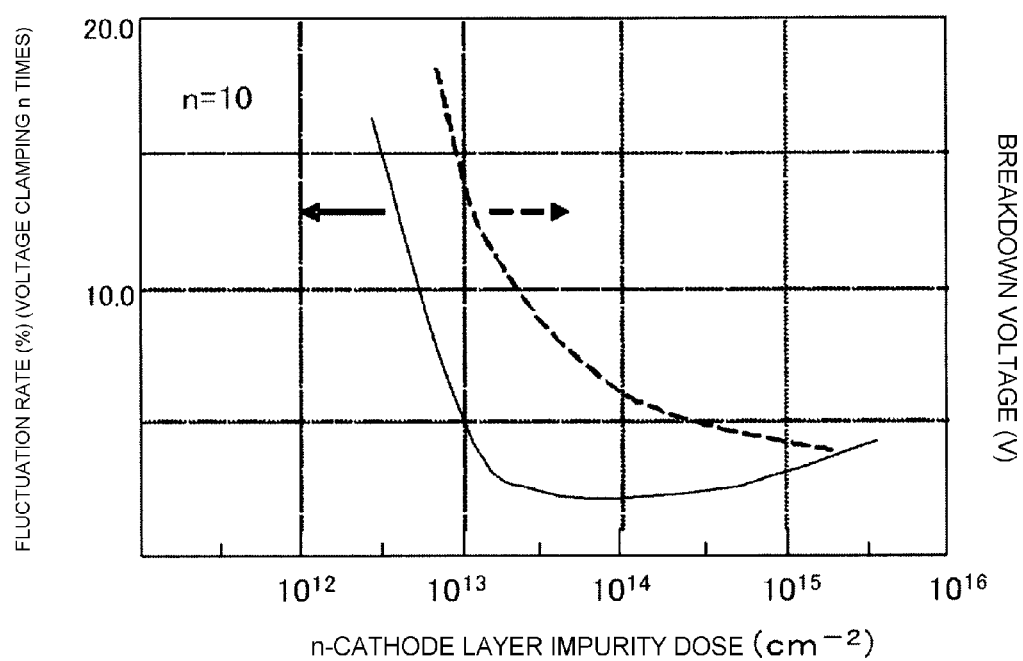
FIG. 5 is a characteristic diagram showing electrical characteristics of a unidirectional diode according to Embodiment 1.
Figure 6:
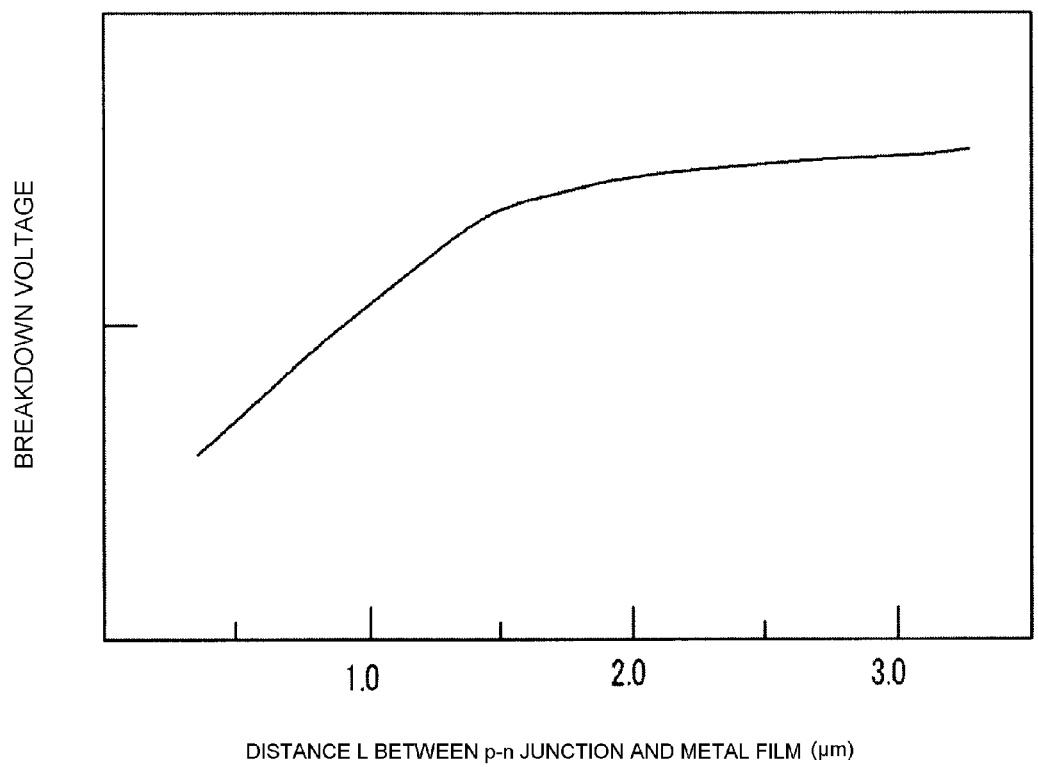
FIG. 6 is a characteristic diagram showing electrical characteristics of the unidirectional diode according to Embodiment 1.
Figure 7:
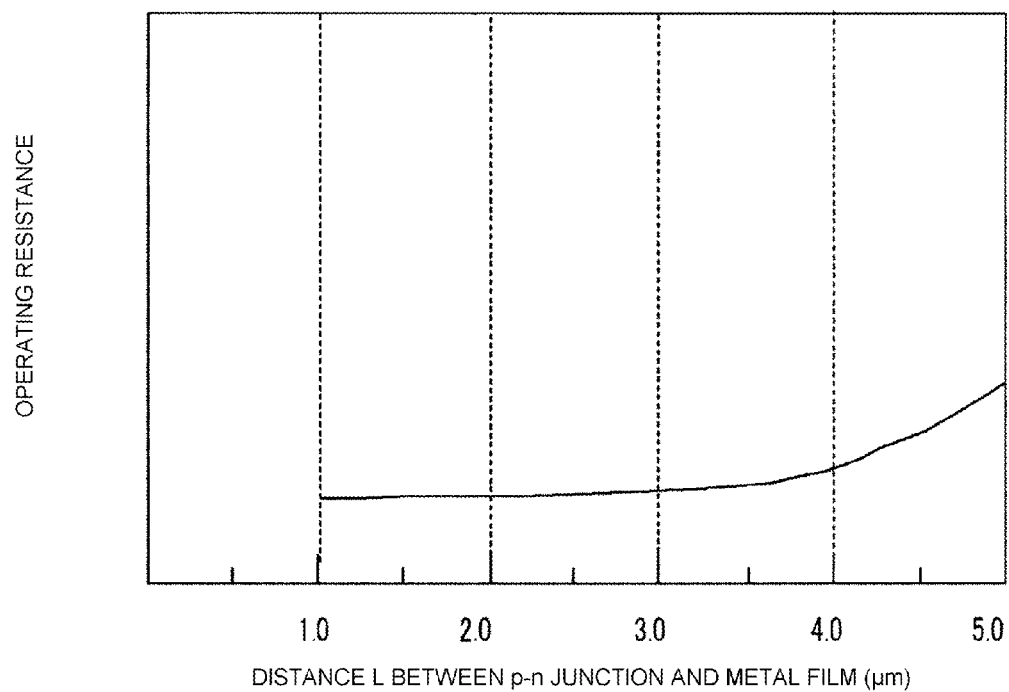
FIG. 7 is a characteristic diagram showing electrical characteristics of the unidirectional diode according to Embodiment 1.

Next, a description will be given of the breakdown voltage stability of the protection diode 71 and of specifications. FIGS. 5 to 7 are characteristic diagrams showing electrical characteristics of the unidirectional diode according to Embodiment 1. FIG. 5 shows the relationship between the breakdown voltage fluctuation rate and initial breakdown voltage of the unidirectional diode 71a, with respect to a clamping voltage application, and the impurity dose of the n-cathode layer 22. FIG. 6 shows the relationship between breakdown voltage and a distance L (refer to FIG. 2) from the p-n junction 74 to the end portion on the p-n junction 74 side of the metal film 53 on the n-cathode layer 22 (hereafter taken to be the distance between the p-n junction 74 and metal film 53). FIG. 7 is a diagram showing the relationship between an operating resistance of the protection diode 71 and the distance L between the p-n junction 74 and metal film 53. Herein, breakdown voltage is the breakdown voltage between the cathode and anode of the protection diode 71, and is a breakdown voltage with respect to an avalanche breakdown or reach-through breakdown. Also, the number of times the protection diode 71 is clamped is in the region of ten times, which is when the breakdown voltage is virtually saturated.

As shown in FIG. 5, the lower the impurity dose of the n-cathode layer 22, the higher the breakdown voltage. Because of this, it is possible to maintain a desired breakdown voltage even when reducing the number of unidirectional diodes 71a connected in series, and it is possible to reduce the area of the protection diode 71. However, when the impurity dose of the n-cathode layer 22 decreases, the breakdown voltage of the protection diode 71 rises when the clamping voltage is repeatedly applied to the protection diode 71, and the protection function is diminished. Meanwhile, when the impurity dose of the n-cathode layer 22 is increased, the breakdown voltage fluctuation rate decreases, but the initial breakdown voltage drops. Consequently, it is necessary to increase the number of unidirectional diodes 71a connected in series in order to maintain the breakdown voltage of the protection diode 71, but the area of the protection diode 71 increases, as a result of which the chip area increases.

As shown in FIG. 6, when the distance L between the p-n junction 74 and metal film 53 is 1.5 μm or less, the breakdown voltage drops. The reason for this is that a depletion layer spreading from the p-n junction 74 reaches through to the metal film 53. Also, as shown in FIG. 7, when the distance L between the p-n junction 74 and metal film 53 is more than 4.0 μm, the operating resistance increases sharply.

Consequently, when forming the protection diode 71 as in the following (1) to (3), it is possible to suppress the rise of the breakdown voltage of the protection diode 71.

(1) It is good that the p-anode layer 21 has an impurity concentration higher than that of the n-cathode layer 22, and the n-cathode layer 22 has an impurity concentration lower than that of the p-anode layer 21.

(2) It is good that the impurity dose in each region of the p-anode layer 21 and n-cathode layer 22 is such that the p-anode layer 21 has an impurity dose of $1.0 \times 10^{15}/cm^2$, and the n-cathode layer 22 has an impurity dose of $1.0 \times 10^{13}/cm^2$ or more, $5.0 \times 10^{14}/cm^2$ or less.

(3) It is good that the distance L between the p-n junction 74 and metal film 53 is 1.5 μm or more, 4.0 μm or less.

Also, by forming the p-anode layer 21 and n-cathode layer 22 using an ion injection, it is possible to reduce the area occupied by each layer in comparison with when forming each layer using a heretofore known vapor phase diffusion.

As heretofore described, according to Embodiment 1, by connecting the protection diode 71, wherein the p-anode layers 21 and n-cathode layers 22 formed from a polysilicon layer are alternately formed and the p-n junctions 74, which are in a reverse blocking state when there is a forward bias, are alternately short circuited with the metal film 53, to the IGBT 72 (power semiconductor element), it is possible to provide a semiconductor device 100 that has a high breakdown capability with respect to a surge voltage, and that has a small chip area. Also, it is possible to maintain a high breakdown capability with respect to a negative surge voltage input into the gate terminal G of the semiconductor device 100.

Also, by the impurity concentration of the n-cathode layer 22 being lower than the impurity concentration of the p-anode layer 21, and the impurity concentration of the n-cathode layer 22 being a dose of $1.0 \times 10^{13}$ $cm^{-2}$ or more, $5.0 \times 10^{14}$ $cm^{-2}$ or less, it is possible to suppress the rise of the breakdown voltage of the protection diode 71, even when the clamping voltage is repeatedly applied.

Also, by the width of the n-cathode layer 22 being 1.5 μm or more, it is possible to suppress the rise of the breakdown voltage of the protection diode 71, even when the clamping voltage is repeatedly applied. Also, by the width of the n-cathode layer 22 being 4.0 μm or less, it is possible to keep the operating resistance low.

Embodiment 2

Figure 8:
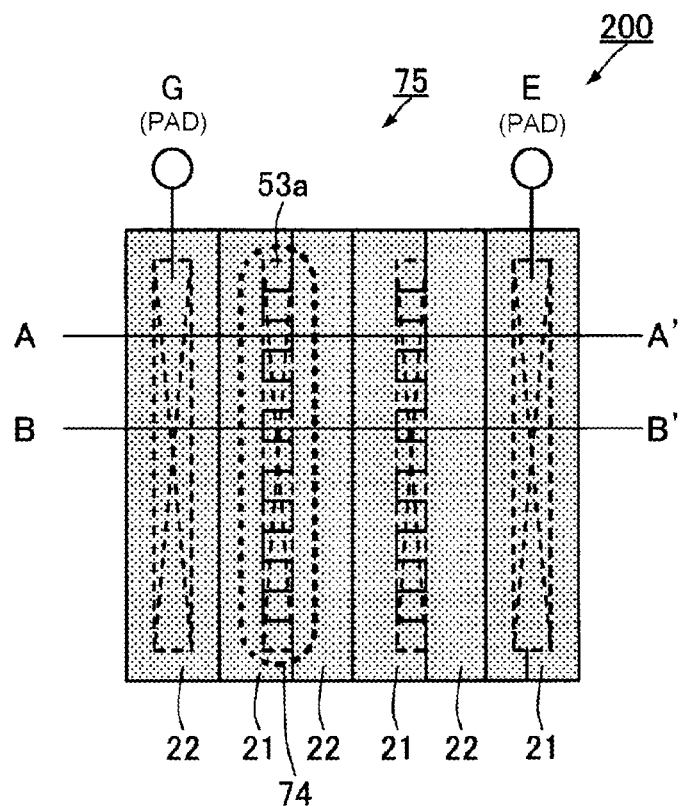
FIG. 8 is an explanatory diagram showing main portions of a configuration of a semiconductor device according to Embodiment 2.
Figure 8:
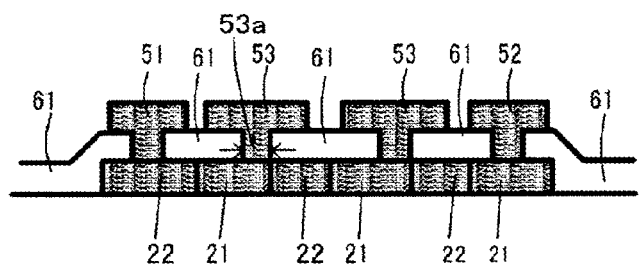
Figure 8:
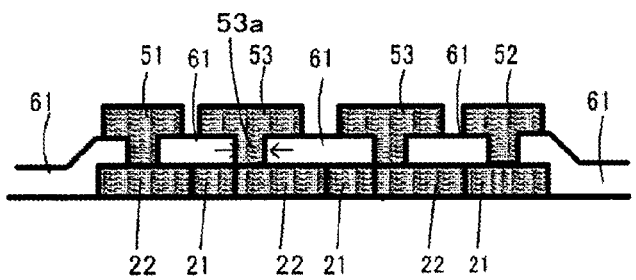

FIG. 8 is an explanatory diagram showing main portions of a configuration of a semiconductor device according to Embodiment 2. FIG. 8(a) is a plan view showing main portions of a semiconductor device 200. FIG. 8(b) is a sectional view showing a sectional structure along a section line A-A' of FIG. 8(a). FIG. 8(c) is a sectional view showing a sectional structure along a section line B-B' of FIG. 8(a). The sectional structure of the semiconductor device 200 is the same as that of the semiconductor device 100 of Embodiment 1 (refer to FIG. 1). FIG. 8 shows only a configuration of a protection diode 75 configuring the semiconductor device 200.

A point differing from the protection diode 71 of Embodiment 1 is that the p-n junction 74 of the p-anode layer 21 and n-cathode layer 22 meshes in a pectinate form. That is, the plan form of the p-n junction 74 short circuited with the metal film 53 is such that the p-anode layer 21 and n-cathode layer 22 fit together in an irregular form. Because of this, even when reducing the size of the contact hole 53a formed on the p-anode layer 21 and n-cathode layer 22, it is possible to secure an area necessary for contact. Because of this, it is possible to reduce the area of the protection diode 75. As a result of this, it is possible to achieve a high breakdown capability and a smaller chip area, in the same way as in Embodiment 1.

As heretofore described, according to Embodiment 2, it is possible to obtain the same advantage as in Embodiment 1.

Embodiment 3

Figure 9:
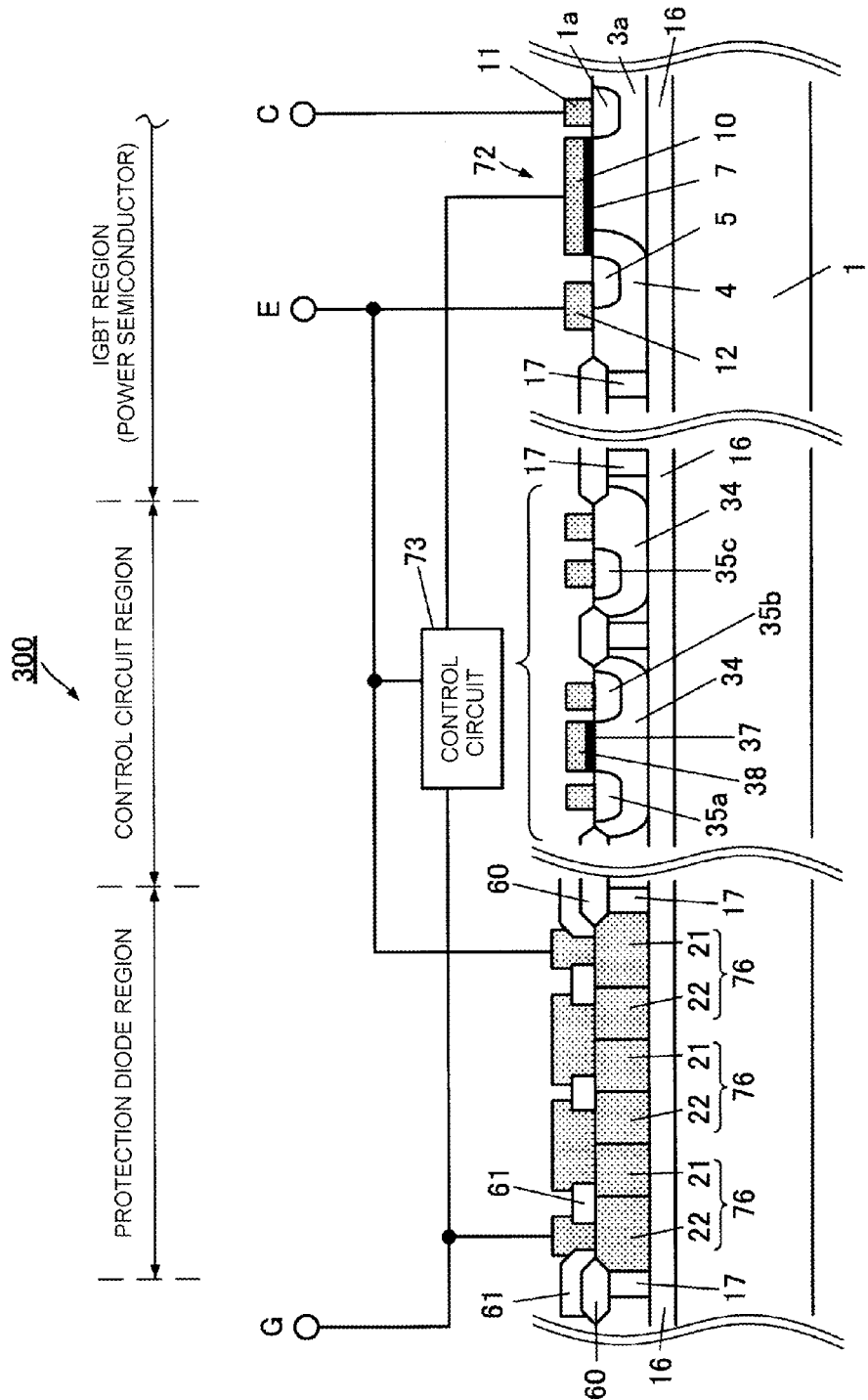
FIG. 9 is a sectional view showing main portions of a semiconductor device according to Embodiment 3.

FIG. 9 is a sectional view showing main portions of a semiconductor device according to Embodiment 3. Points differing from Embodiment 1 are the following points. An SOI (silicon on insulator) substrate, wherein a semiconductor layer is formed across an insulating layer 16 on the semiconductor substrate 1, or the like, is used. Taking this semiconductor layer to be the low concentration n-semiconductor layer 3a, an insulating separation region 17 is formed reaching the insulating layer 16 from the surface of the low concentration n-semiconductor layer 3a (the surface of the SOI substrate), thus dividing the low concentration n-semiconductor layer 3a. Then, a differing point is that a protection diode 76 is formed in one of the low concentration n-semiconductor layers 3a separated by the insulating separation region 17. That is, the protection diode 76 configuring this semiconductor device 300 is formed not of a polysilicon layer, but of a single crystal silicon layer (the low concentration n-semiconductor layer 3a).

Also, the IGBT 72 is a lateral IGBT formed on the low concentration n-semiconductor layer 3a, wherein a p-collector layer 1a is formed in a surface layer of the low concentration n-semiconductor layer 3a. In this case too, it is possible to achieve a smaller chip area while maintaining the same kind of high breakdown capability as in Embodiment 1. The conductivity type of the semiconductor substrate may be either the p-type or the n-type.

As heretofore described, according to Embodiment 3, it is possible to obtain the same advantage as in Embodiment 1.

Embodiment 4

Figure 10:
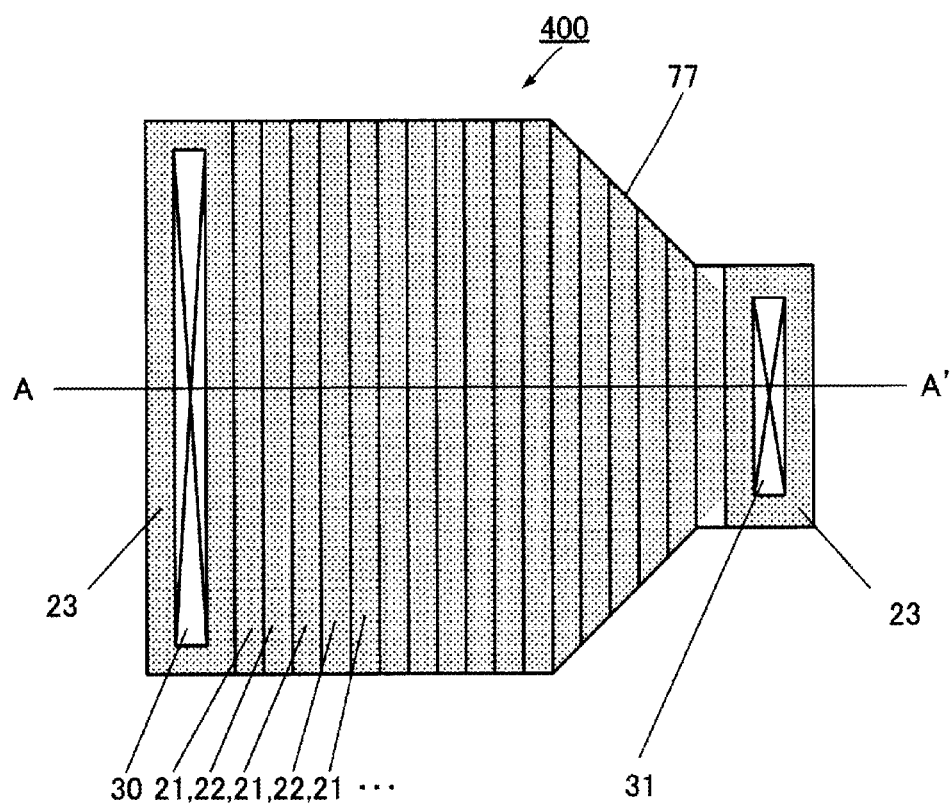
FIG. 10 is an explanatory diagram showing main portions of a configuration of a semiconductor device according to Embodiment 4.
Figure 10:
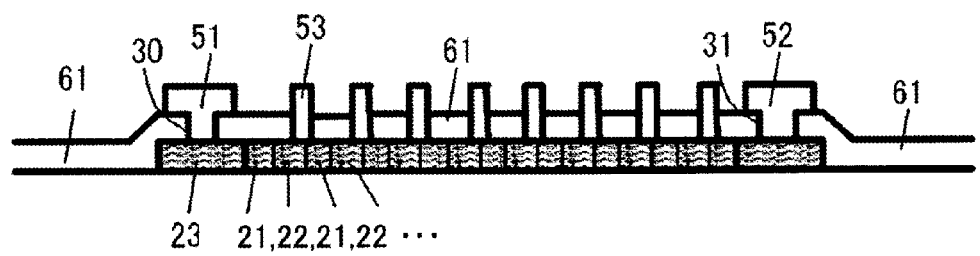

FIG. 10 is an explanatory diagram showing main portions of a configuration of a semiconductor device according to Embodiment 4. FIG. 10(a) is a plan view showing main portions of a semiconductor device 400. FIG. 10(b) is a sectional view showing a sectional structure along a section line A-A' of FIG. 10(a). The sectional structure of the semiconductor device 400 is the same as that of the semiconductor device 100 of Embodiment 1 (refer to FIG. 1). FIG. 10 shows only a configuration of a protection diode 77 configuring the semiconductor device 400.

A point differing from the protection diode 71 of Embodiment 1 is that a low concentration n-cathode layer in contact with the cathode electrode 51 of the protection diode 77 connected to the gate terminal G is formed of two layers, the low concentration n-cathode layer 22 and a high concentration n-cathode layer 23, wherein the vicinity of a place forming a contact hole 30 is taken to be the high concentration n-cathode layer 23, and places other than this are taken to be the low concentration n-cathode layer 22. The low concentration n-cathode layer 22 has an impurity concentration lower than that of the high concentration n-cathode layer 23. As the contact resistance may increase when forming the cathode electrode 51 in the low concentration n-cathode layer 22, it is preferable that the contact portion is of a high concentration. Also, the anode electrode 52 of the protection diode 77 connected to the emitter electrode 12 of the IGBT 72 is in contact with the high concentration n-cathode layer 23 via a contact hole 31.

Also, a point differing from FIG. 2 is that the cathode electrode 51 is wider than the anode electrode 52. Because of this, it is possible for the wire connected to the anode electrode 52 to be narrower. Also, as it is possible for the sectional area of the p-n junction 74 to be larger owing to the cathode electrode 51 being wider, it is possible to maintain a high breakdown capability.

Figure 18:
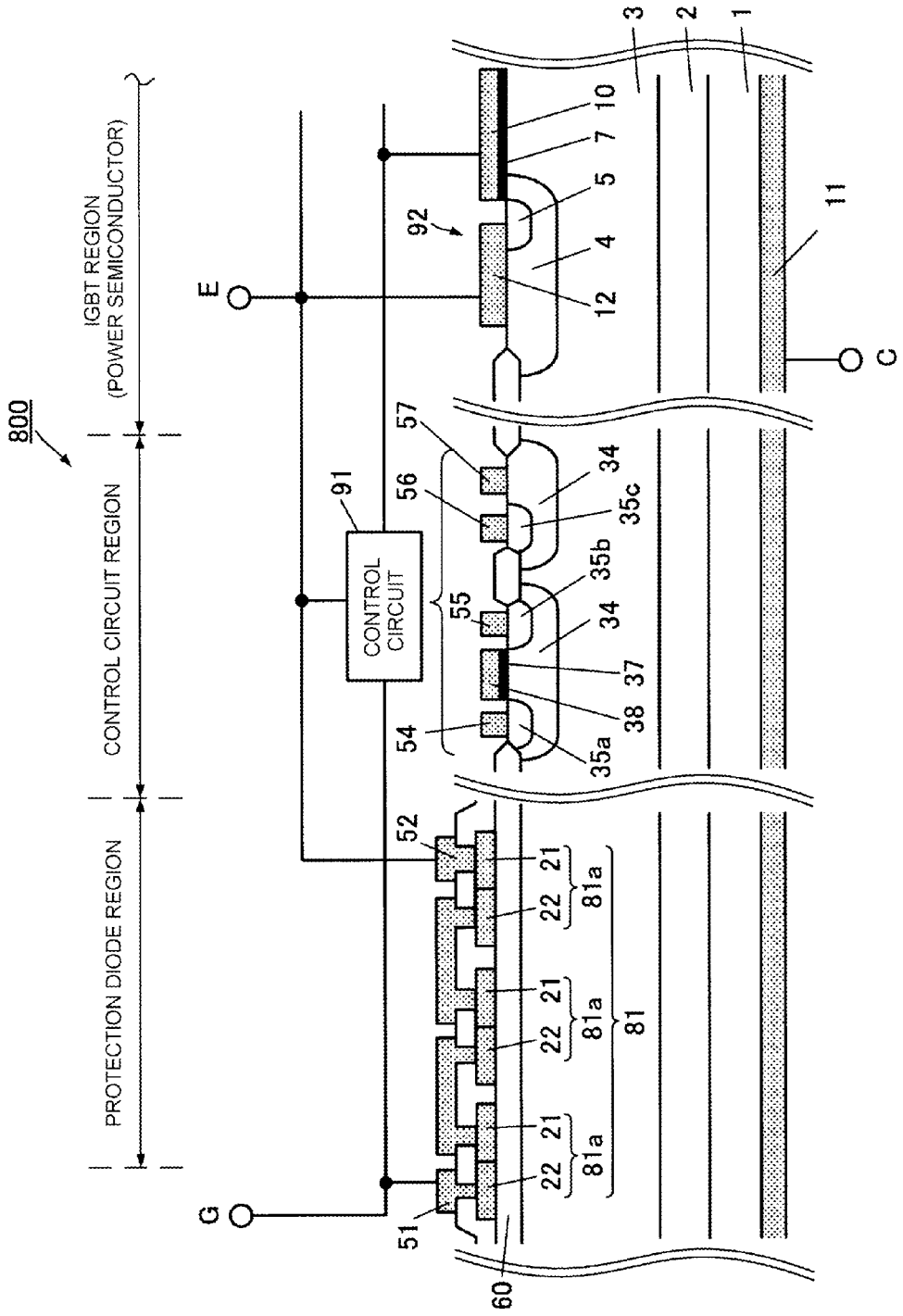
FIG. 18 is a sectional view showing main portions of a semiconductor device having a heretofore known protection diode.

As heretofore described, according to Embodiment 4, it is possible to obtain the same advantage as in Embodiment 1. Also, although the chip area of the semiconductor device 400 is somewhat larger than that of the semiconductor device 100 (refer to FIG. 1), it is possible to achieve a higher breakdown capability and a smaller chip area in comparison with a heretofore known semiconductor device 800 shown in FIG. 18. Also, an ohmic contact is obtained by the n-cathode layer 23 in contact with the cathode electrode 51 of the protection diode 77 being formed as a high concentration layer, and the high concentration layer being higher than $1.0 \times 10^{13}$ cm$^{-2}$ or more, $5.0 \times 10^{14}$ cm$^{-2}$ or less, which is the impurity dose of the low concentration layer (n-cathode layer 22).

Embodiment 5

Figure 11:
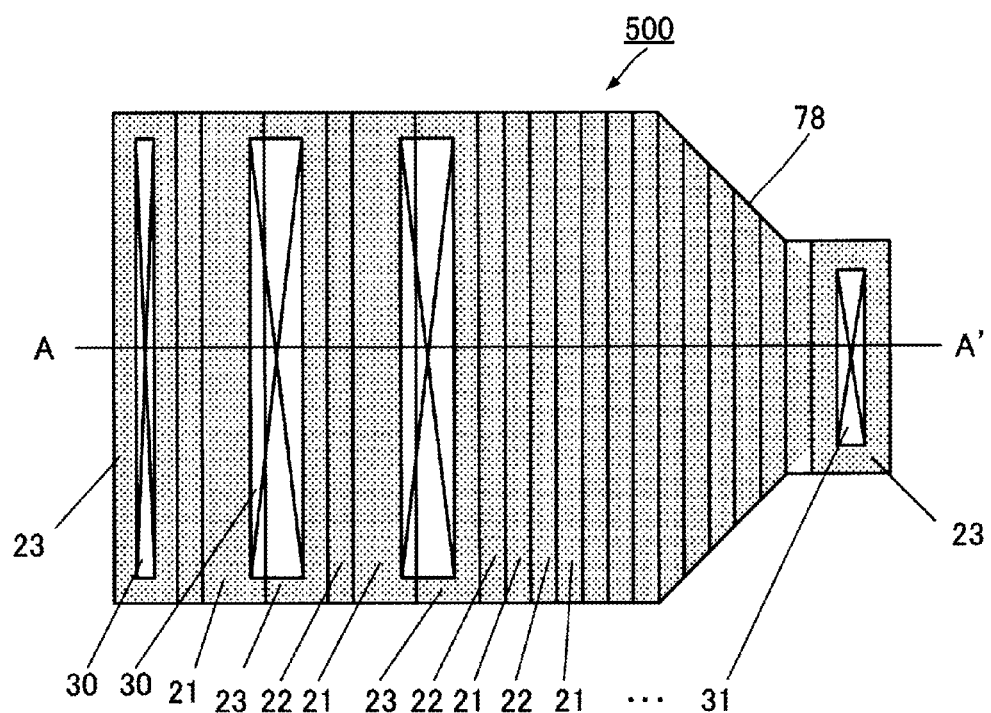
FIG. 11 is an explanatory diagram showing main portions of a configuration of a semiconductor device according to Embodiment 5.
Figure 11:
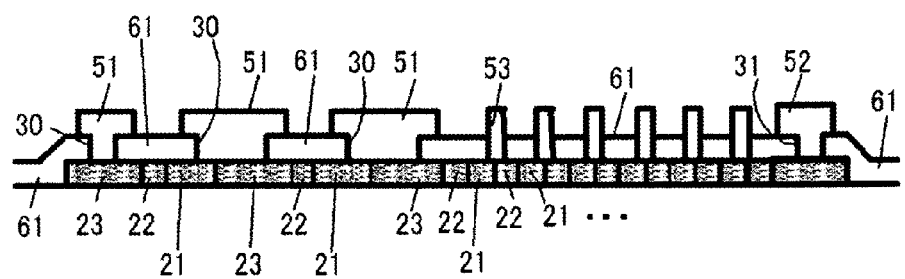

FIG. 11 is an explanatory diagram showing main portions of a configuration of a semiconductor device according to Embodiment 5. FIG. 11(a) is a plan view showing main portions of a semiconductor device 500. FIG. 11(b) is a sectional view showing a sectional structure along a section line A-A' of FIG. 11(a). The sectional structure of the semiconductor device 500 is the same as that of the semiconductor device 100 of Embodiment 1 (refer to FIG. 1). FIG. 11 shows only a configuration of a protection diode 78 configuring the semiconductor device 500.

A point differing from the protection diode 71 of Embodiment 1 is that an independent plural cathode electrodes 51 are formed. In this case, by selecting the cathode electrode 51 of the protection diode 78 to be connected to the collector of the IGBT 72 from among the plural cathode electrodes 51, it is possible to carry out an adjustment of the protection diode 78 breakdown voltage.

As heretofore described, according to Embodiment 5, it is possible to obtain the same advantage as in Embodiment 1. Also, although the chip area of the semiconductor device 500 is somewhat larger than that of the semiconductor device 100, it is possible to achieve a higher breakdown capability and a smaller chip area in comparison with the heretofore known semiconductor device 800 shown in FIG. 18.

In the heretofore described Embodiments 1 to 5, it has been described that, by controlling the impurity concentration of the low concentration n-semiconductor layer (n-cathode layer) 22 to a predetermined value, it is possible to prevent a rise of the protection diode breakdown voltage, even when the clamping voltage is applied plural times.

Next, a description will be given of an example wherein, by arranging that the length of the low concentration n-semiconductor layer 22 is a length such that the depletion layer unfailingly reaches through at the clamping voltage, it is possible to suppress the rise of the protection diode breakdown voltage, even when the clamping voltage is applied repeatedly. Herein, a description will be given of, as an example, a case wherein, the impurity concentrations being the reverse of those in Embodiment 1, the p-anode layer is of a low concentration, and the n-cathode layer is of a high concentration.

Figure 12:
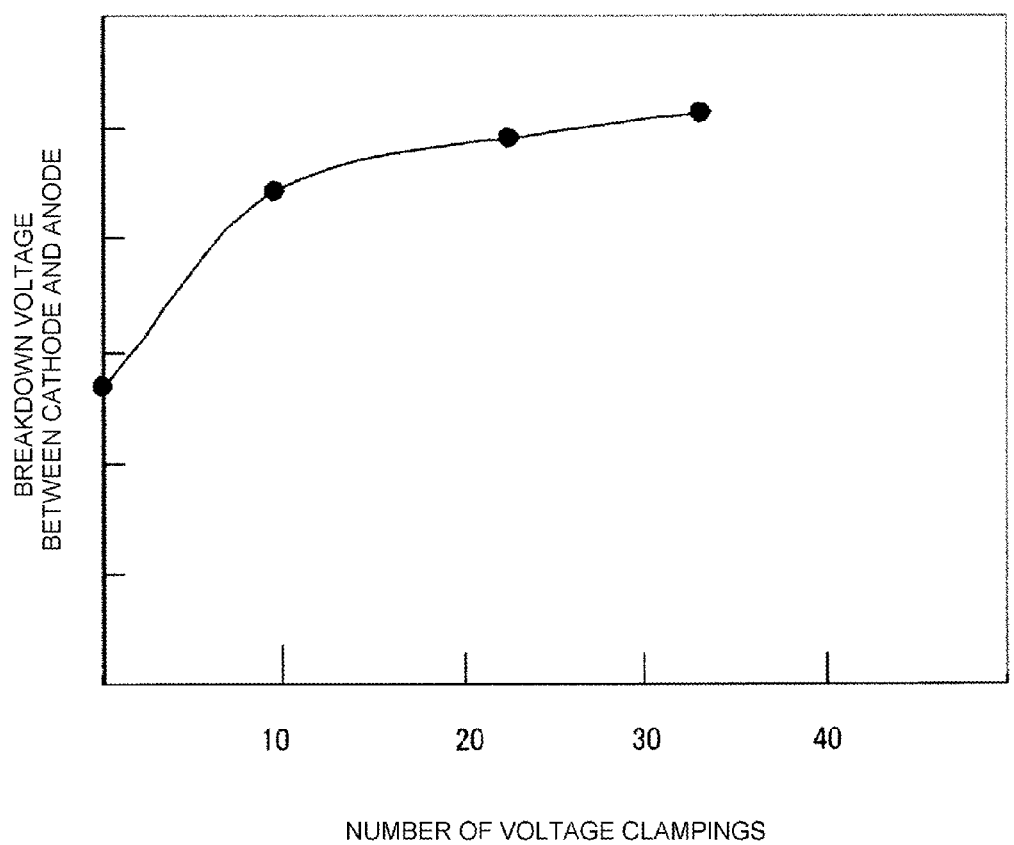
FIG. 12 is an explanatory diagram showing the relationship between the number of voltage clampings and protection diode breakdown voltage.

Firstly, a description will be given of a situation wherein the protection diode breakdown voltage rises in response to an increase in the number of clampings. FIG. 12 is an explanatory diagram showing the relationship between the number of voltage clampings and the protection diode breakdown voltage. The impurity concentration of a p-layer that is a low concentration layer is $1 \times 10^{14}$ cm$^{-2}$, the impurity concentration of an n-layer that is a high concentration layer is $5 \times 10^{15}$ cm$^{-2}$, and the impurity concentration of a p-layer that is a high concentration layer is $3 \times 10^{15}$ cm$^{-2}$. As shown in FIG. 12, the protection diode breakdown voltage rises as the number of clampings increases, and the breakdown voltage between the cathode and anode tends toward saturation when the number of clampings increases. This breakdown voltage, being the breakdown voltage between the cathode and anode, is a breakdown voltage that occurs at an avalanche breakdown.

Embodiment 6

Figure 13:
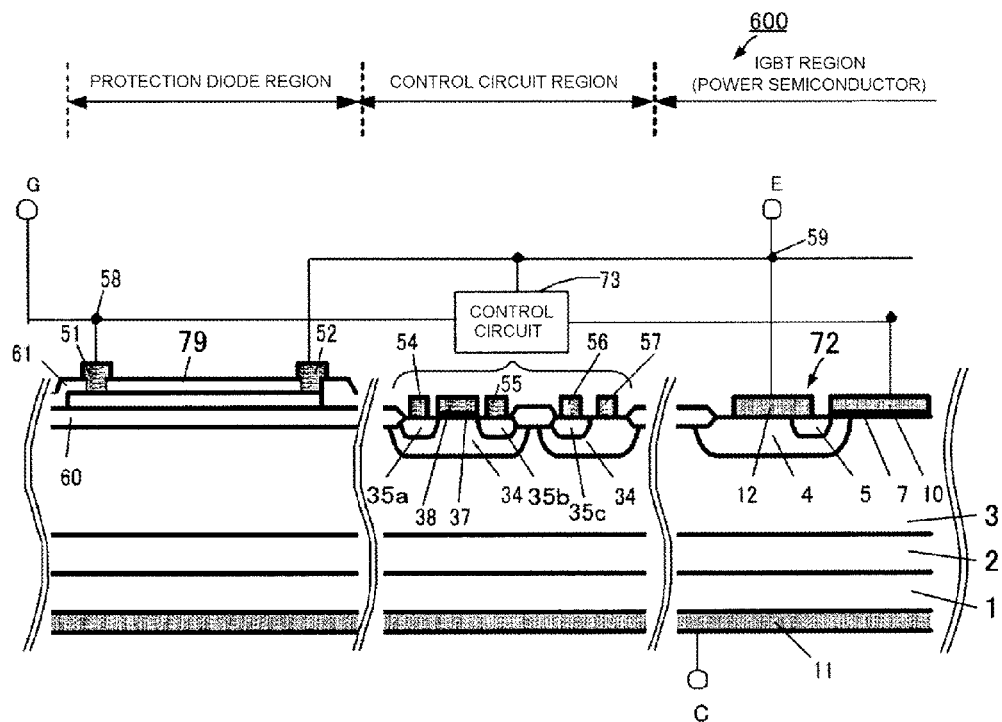
FIG. 13 is an explanatory diagram showing main portions of a configuration of a semiconductor device according to Embodiment 6.
Figure 13:
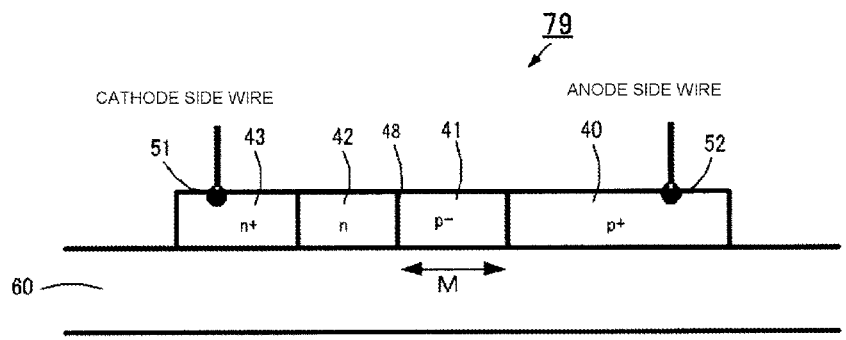
Figure 14:
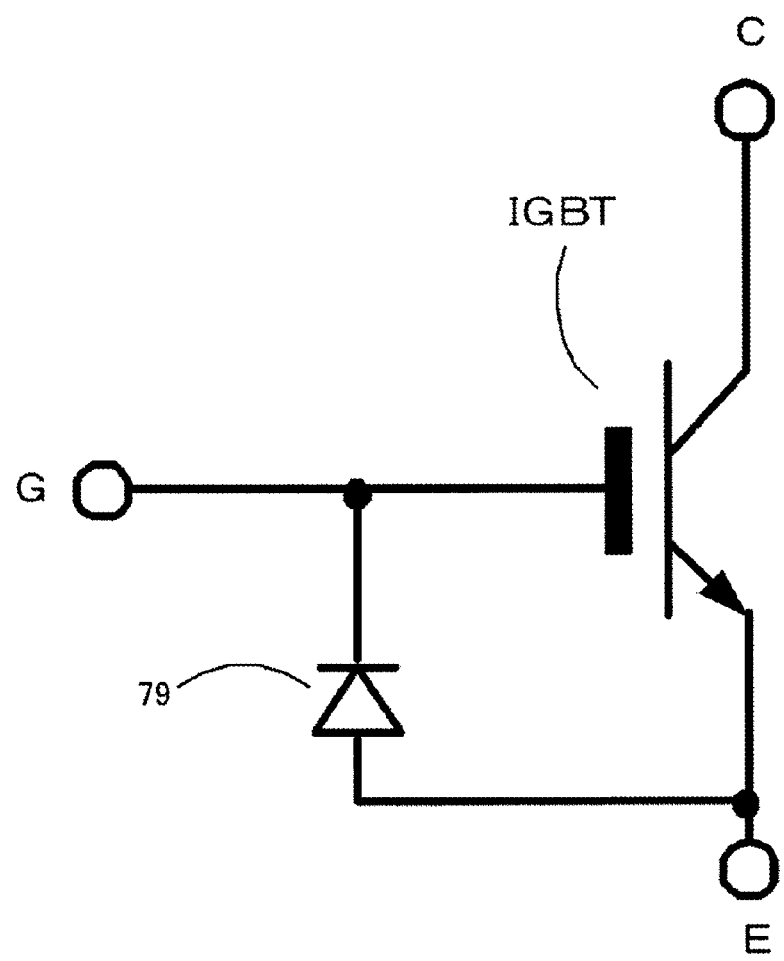
FIG. 14 is an equivalent circuit diagram showing the semiconductor device of FIG. 13.
Figure 15:
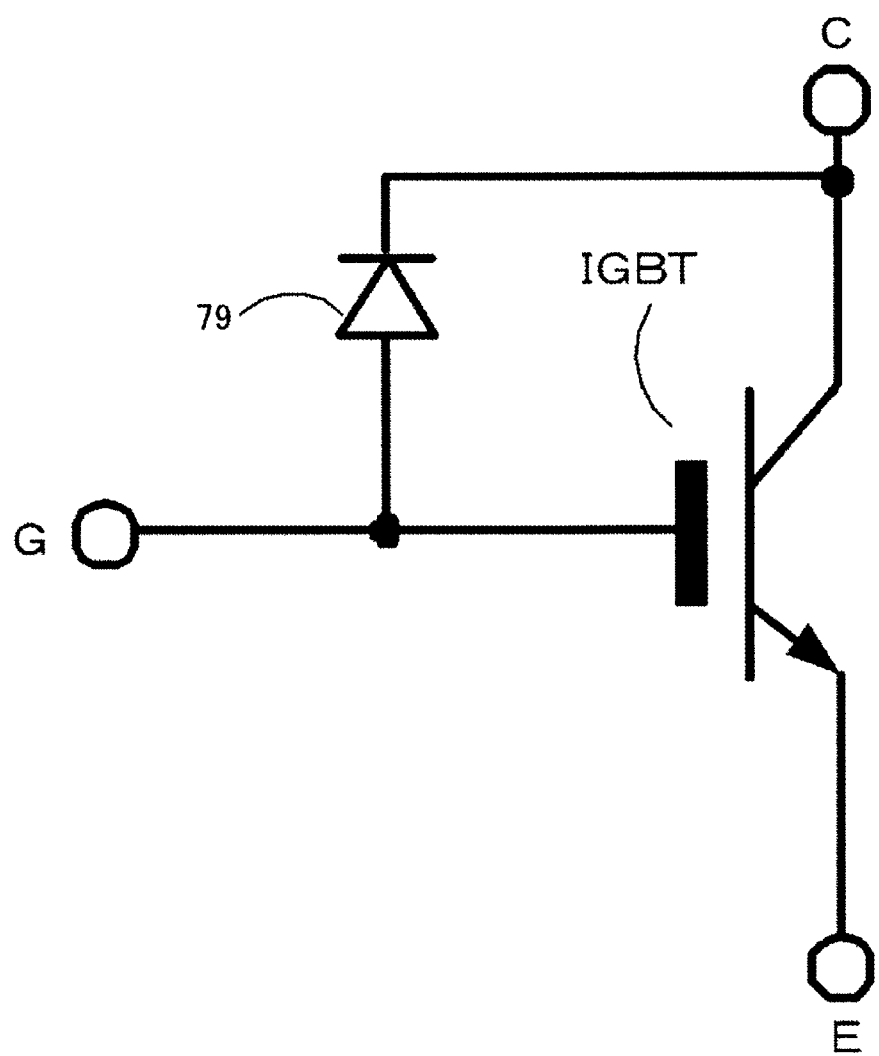
FIG. 15 is an equivalent circuit diagram showing the semiconductor device of FIG. 13.

FIG. 13 is an explanatory diagram showing main portions of a configuration of a semiconductor device according to Embodiment 6. FIG. 13(a) is a sectional view showing main portions of a semiconductor device 600. FIG. 13(b) is a sectional view showing in detail a protection diode 79. The protection diode 79 configuring the semiconductor device 600 is configured of unidirectional single diodes. FIGS. 14 and 15 are equivalent circuits showing the semiconductor device of FIG. 13. FIG. 14 shows an equivalent circuit when the protection diode 79 is inserted between the gate and emitter of the IGBT. FIG. 15 shows an equivalent circuit when the protection diode 79 is inserted between the gate and collector of the IGBT. The unidirectional diodes configuring the protection diode 79 are a p-anode layer 41 (a low concentration layer), an n-cathode layer 42 (a medium concentration layer), and a high concentration n-cathode layer 43 and p-anode layer 40 (high concentration layers) disposed one at either end. The p-anode layer 41 has an impurity concentration lower than that of the n-cathode layer 42. The n-cathode layer 42 has an impurity concentration lower than that of the n-cathode layer 43 and p-anode layer 40. The n-cathode layer 43 is in contact with the n-cathode layer 42. The n-cathode layer 42 is in contact with the p-anode layer 41. The p-anode layer 41 is in contact with the p-anode layer 40. The n-cathode layer 43 and p-anode layer 40 are contact layers of the cathode electrode 51 and anode electrode 52 respectively. Hereafter, of the plural unidirectional diodes configuring the protection diode, one whose impurity concentration is lower than that of the other unidirectional diodes is taken to be of a low concentration, while those whose impurity concentration is higher than that of the low concentration layer are taken to be of a medium concentration or high concentration. The medium concentration layer has an impurity concentration lower than that of the high concentration layers.

A description will be given of a method of manufacturing the unidirectional diodes that are the protection diode 79. Polysilicon of a thickness of 0.5 μm is deposited on the insulating film 60 (LOCOS oxide film), and processed into a diode form using photolithography and etching. Boron is ion injected at a low concentration of, for example, a dose of in the region of $6 \times 10^{13}$ cm$^{-2}$ or more, $9 \times 10^{13}$ cm$^{-2}$ or less over the whole surface of the polysilicon layer. Also, phosphorus or arsenic is selectively ion injected to a dose of in the region of $2 \times 10^{14}$ cm$^{-2}$ or more, $9 \times 10^{14}$ cm$^{-2}$ or less into the n-cathode layer 42, which is of a medium concentration. Boron is selectively ion injected at a high concentration of, for example, a dose of in the region of $3 \times 10^{15}$ cm$^{-2}$ into the high concentration p-anode layer 40. Phosphorus or arsenic is selectively ion injected at a high concentration of, for example, a dose of in the region of $5 \times 10^{15}$ cm$^{-2}$ into the high concentration n-cathode layer 43. At this time, it is arranged in such a way that a width M of the low concentration p-anode layer 41 sandwiched by the high concentration p-anode layer 40 and medium concentration n-cathode layer 42 is 2 μm or less. That is, the protection diode 79 is configured of four layers of unidirectional diode, those being an n$^+$ layer (the high concentration n-cathode layer 43), an n-layer (the medium concentration n-cathode layer 42), a p$^-$ layer (the low concentration anode layer 41), and a p$^+$ layer (the high concentration p-anode layer 40). The n$^+$ layer and p$^+$ layer provided in the end portions of the protection diode 79 are of a high concentration in order to obtain an ohmic contact with a metal wire.

A p-n junction 48 of the protection diode 79 is formed of the low concentration p-anode layer 41 and medium concentration n-cathode layer 42. When the width M of the low concentration p-anode layer 41 is large to the extent that there is no reach-through, a depletion layer extending from the p-n junction 48 when a voltage is applied between the cathode and anode spreads to the low concentration p-anode layer 41, and an electric field in the p-n junction 48 reaches a critical electric field, causing an avalanche breakdown. The breakdown voltage of the protection diode 79 at this time is determined by the impurity concentration of the low concentration layer and medium concentration layer.

Also, when the width M of the low concentration p-anode layer 41 is smaller than the width of the spread of the depletion layer to the extent that there is reach-through, the breakdown voltage of the protection diode 79 is determined by the voltage at which the depletion layer reaches through. That is, the breakdown voltage of the protection diode 79 depends on the width M of the low concentration p-anode layer 41.

Figure 16:
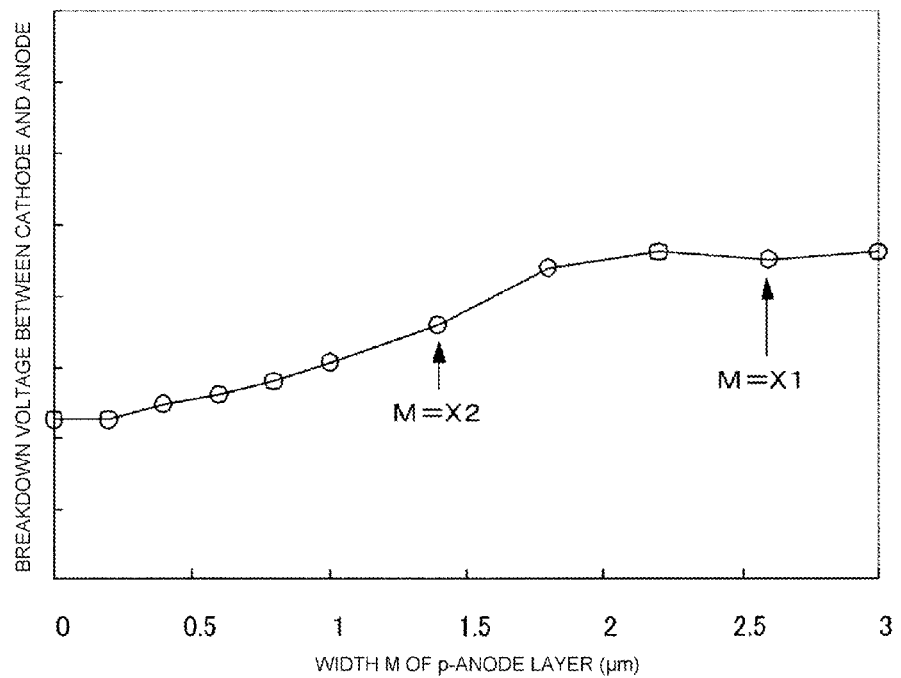
FIG. 16 is a characteristic diagram showing the relationship between the protection diode breakdown voltage of FIG. 13 and the width of a low concentration p-anode layer.

FIG. 16 is a characteristic diagram showing the relationship between the protection diode breakdown voltage of FIG. 13 and the width of the low concentration p-anode layer. The breakdown voltage of the protection diode 79 is the breakdown voltage between the cathode and anode (hereafter, the same also applies to FIG. 17). In this example, the high concentration p-anode layer 40, low concentration p-anode layer 41, and medium concentration n-cathode layer 42 are formed by an ion injection of $3 \times 10^{15}$ cm$^{-2}$ of boron, $7 \times 10^{13}$ cm$^{-2}$ of boron, and $5 \times 10^{14}$ cm$^{-2}$ of arsenic respectively. When the width M of the low concentration p-anode layer 41 is decreased, the depletion layer reaches through to the high concentration p-anode layer 40, and the breakdown voltage between the cathode and anode drops in response to the contraction of the width M of the low concentration p-anode layer 41. When the width M of the low concentration p-anode layer 41 is 0 μm, the breakdown voltage between the cathode and anode is a breakdown voltage determined by the p-n junction 48 of the high concentration p-anode layer 40 and medium concentration n-cathode layer 42. The width at which the depletion layer causes reach-through is in the region of 2 μm when the medium concentration n-cathode layer 42 and low concentration p-anode layer 41 are formed by an ion injection of a dose at the level of the power of 14 and power of 13 respectively, with reach-through occurring at that width or less. That is, when the width M of the low concentration p-anode layer 41 is 2 μm or less, the breakdown voltage between the cathode and anode is determined by the voltage that causes reach-through. Because of this, by arranging that the width M of the low concentration p-anode layer 41 is 2 μm or less, the rise of the breakdown voltage of the protection diode 79 is suppressed even when a repeated clamping voltage is applied. Also, when arranging so that the medium concentration n-cathode layer 42 has the same degree of impurity concentration as the low concentration p-anode layer 41, it is possible to increase the breakdown voltage of the protection diode 79.

Figure 17:
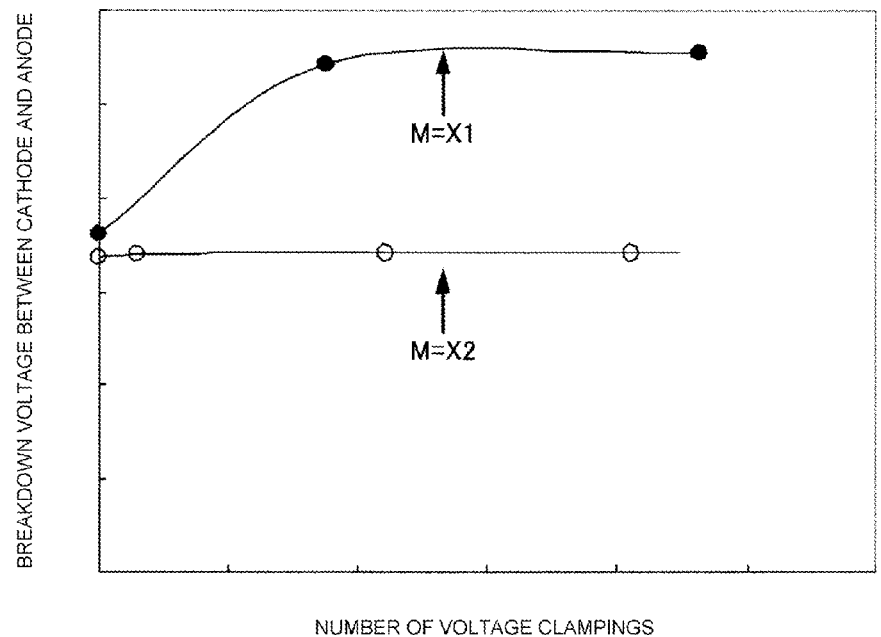
FIG. 17 is a characteristic diagram showing the relationship between the protection diode breakdown voltage of FIG. 13 and the number of voltage clampings.

FIG. 17 is a characteristic diagram showing the relationship between the protection diode breakdown voltage of FIG. 13 and the number of voltage clampings. In FIG. 17, the width M of the low concentration p-anode layer 41 is taken as a parameter. The widths M of the low concentration p-anode layer 41 are the values of widths X1 and X2 shown in FIG. 16. Although both of the widths X1 and X2 show the same degree of initial breakdown voltage, reach-through does not occur at the clamping voltage in the unidirectional diode formed to M=X1. Meanwhile, in the unidirectional diode formed to M=X2, reach-through occurs at the clamping voltage. In the unidirectional diode in which reach-through does not occur (M=X1), the voltage rises when a repeated clamping voltage is applied, as in the heretofore known unidirectional diode.

As opposed to this, no rise in breakdown voltage is observed in the unidirectional diode in which reach-through occurs (M=X2). This protection diode, as heretofore described, is formed of plural unidirectional diodes, those being the high concentration p-anode layer 40 with which the anode terminal is in contact, the high concentration n-cathode layer 43 with which the cathode terminal is in contact, and the low concentration p-anode layer 41 and medium concentration n-cathode layer 42, formed to a low concentration lower than that of either high concentration layer, disposed between the high concentration layers (refer to FIG. 13). As the width M of the low concentration p-anode layer 41 is formed to a width (reach-through width) such that reach-through occurs at the clamping voltage, the protection diode suppresses the rise in breakdown voltage caused by a repetition of the clamping operation. Also, it is possible to change the breakdown voltage between the cathode and anode by changing the impurity concentration and length of the medium concentration n-cathode layer 42.

By arranging that the width M of the low concentration p-anode layer 41 of the protection diode 79 is 2 μm or less, the breakdown voltage of the protection diode 79 is the voltage (reach-through voltage) at which reach-through of the depletion layer is caused, and it is possible to prevent a rise of the breakdown voltage of the protection diode 79 caused by a repeated application of the clamping voltage. Owing to the rise of the breakdown voltage of the protection diode 79 being suppressed, the semiconductor device 600 has a high breakdown capability. Furthermore, as the clamping voltage is determined by the reach-through voltage, it is possible for the width M of the low concentration p-anode layer 41 to be smaller in comparison with when the clamping voltage is determined by an avalanche breakdown voltage. As a result of this, it is possible to achieve high breakdown capability and a smaller chip area.

In Embodiment 6, there is shown an example wherein unidirectional diodes are inserted as the protection diode 79 between the gate and emitter of the IGBT 72, as in FIG. 14, but the unidirectional diodes may also be inserted between the collector and gate, as in FIG. 15.

Also, although not shown, it is possible with the protection diode 79 of Embodiment 6 to obtain the same advantage even when replacing the low concentration p-anode layer 41 with a medium concentration p-anode layer, replacing the medium concentration n-cathode layer 42 with a low concentration n-cathode layer, and arranging so that the width of the low concentration n-cathode layer is a width such that reach-through occurs.

Also, although not shown, by arranging so that the protection diode is a multi-stage unidirectional diode, wherein unidirectional diodes are connected in series in a forward direction, and a connected anode electrode and cathode electrode are formed of one metal film, it is possible to increase the breakdown voltage. In this case, the protection diode is configured of an $n^+$ layer (high concentration layer), an $n^+$ layer (medium concentration), a $p^-$ layer (low concentration layer), a $p^+$ layer (high concentration layer), an $n^+$ layer (high concentration layer), an n-layer (medium concentration), a $p^-$ layer (low concentration layer), and a $p^+$ layer (high concentration layer). Then, the top of a junction portion of the $p^+$ layer (high concentration layer) and $n^+$ layer (high concentration layer) is covered with one metal film, forming an ohmic junction. Also, by adopting a configuration wherein this configuration is repeated, it is possible to change and adjust the breakdown voltage of the protection diode.

Also, although not shown, the protection diode may also be configured as a bidirectional diode wherein unidirectional diodes are connected back-to-back (reverse direction). In this case, the protection diode is configured of an $n^+$ layer (high concentration layer), an n-layer (medium concentration), a $p^-$ layer (low concentration layer), a $p^+$ layer (high concentration layer), a $p^-$ layer (low concentration layer), an n-layer (medium concentration layer), and an $n^+$ layer (high concentration layer). Also, by adopting a configuration wherein this configuration is repeated, it is possible to change and adjust the breakdown voltage of the protection diode.

Also, as heretofore described, by alternately short circuiting the p-n junctions of a large number of series connected bidirectional diodes with a metal film, it is possible to obtain series connected unidirectional diodes. Even when inserting a protection diode configured of the unidirectional diodes between the gate and emitter or gate and connector of the IGBT, it is possible to obtain the same advantage.

Also, although a description has been given of an example wherein the protection diode 79 is formed in a polysilicon layer, the protection diode 79 may also be formed in a single crystal silicon layer formed on an insulating film such as an SOI substrate. This can be applied to all the protection diodes described in Embodiment 6.

As heretofore described, according to Embodiment 6, it is possible to obtain the same advantage as in Embodiment 1.

Also, in Embodiments 1 to 6, a description has been given with the IGBT 72, which is a power semiconductor element, as an example of a semiconductor element that is a protected element, but it is possible to obtain the same advantage as previously described by applying the invention to a power MOS element, such as a power MOSFET.

INDUSTRIAL APPLICABILITY

As heretofore described, the semiconductor device according to the embodiment is useful as a semiconductor device wherein a surge protection diode that protects a power semiconductor element from a surge voltage applied from the exterior, or a surge voltage generated from the element itself when switching, is formed on the same semiconductor substrate as the power semiconductor element.

DESCRIPTION OF REFERENCE NUMERALS AND SIGNS 1 p-semiconductor substrate
1a p-collector layer
2 High concentration n-semiconductor layer
3, 3a Low concentration n-semiconductor layer
4 p-well layer
5 n-emitter layer
7 Gate insulating film
10 Gate electrode
11 Collector electrode
12 Emitter electrode
16 Insulating layer (oxide film)
17 Insulating separation region
21, 40 High concentration p-anode layer
22 Low concentration n-cathode layer
23, 43 High concentration n-cathode layer
30, 31, 51a, 52a, 53a Contact hole
34 p-well layer
35a n-source layer
35b n-drain layer
35c n-cathode layer
37 Gate insulating film
38 Gate electrode
41 Low concentration p-anode layer
42 Medium concentration n-cathode layer
48, 74 p-n junction
51, 56 Cathode electrode
52, 57 Anode electrode
53 Metal film
54 Source electrode
55 Drain electrode
58, 59 Pad electrode
60 Insulating film
61 Interlayer insulating film
71, 75, 76, 77, 78, 79 Protection diode
71a Unidirectional diode
72 IGBT
73 Control circuit
100, 200, 300, 400, 500, 600, 800, 900 Semiconductor device
L Distance between p-n junction and metal film
M Width of low concentration p-anode layer
G Gate terminal
E Emitter terminal
C Collector terminal

The invention claimed is:

1. A semiconductor device characterized by including at least
a semiconductor element, and
a protection diode formed across an insulating film on a semiconductor substrate on which the semiconductor element is formed, wherein
a cathode electrode of the protection diode is connected to a gate electrode of the semiconductor element,
an anode electrode of the protection diode is connected to a low potential side main electrode of the semiconductor element,
the protection diode is configured of four layers of unidirectional diode formed in contact in the order of a high concentration first conductivity type semiconductor layer, a medium concentration first conductivity type semiconductor layer, a low concentration second conductivity type semiconductor layer, and a high concentration second conductivity type semiconductor layer, and
the width of the low concentration second conductivity type semiconductor layer is a width such that a depletion layer reaches through at a clamping voltage.

2. A semiconductor device characterized by including at least
a semiconductor element, and
a protection diode formed across an insulating film on a semiconductor substrate on which the semiconductor element is formed, wherein
a cathode electrode of the protection diode is connected to a high potential side main electrode of the semiconductor element,
an anode electrode of the protection diode is connected to a gate electrode of the semiconductor element,
the protection diode is configured of four layers of unidirectional diode formed in contact in the order of a high concentration first conductivity type semiconductor layer, a medium concentration first conductivity type semiconductor layer, a low concentration second conductivity type semiconductor layer, and a high concentration second conductivity type semiconductor layer, and
the width of the low concentration second conductivity type semiconductor layer is a width such that a reach-through of a depletion layer occurs at a clamping voltage.

3. The semiconductor device according to claim 1 or 2, characterized in that
the cathode electrode or anode electrode of the protection diode is connected to the gate electrode of the semiconductor element via a control circuit formed on the semiconductor substrate.

4. The semiconductor device according to claim 1 or 2, characterized in that
the protection diode is a multi-stage unidirectional diode formed of the four layers of unidirectional diode connected in series in a forward direction.

5. A semiconductor device characterized by including at least
a semiconductor element, and
a protection diode formed across an insulating film on a semiconductor substrate on which the semiconductor element is formed, wherein
one main electrode of the protection diode is connected to a low potential side main electrode of the semiconductor element,
the other main electrode of the protection diode is connected to a gate electrode of the semiconductor element,
the protection diode is configured of seven layers of bidirectional diode formed in contact in the order of a high concentration first conductivity type semiconductor layer, a medium concentration first conductivity type semiconductor layer, a low concentration second conductivity type semiconductor layer, a high concentration second conductivity type semiconductor layer, a low concentration second conductivity type semiconductor layer, a medium concentration first conductivity type semiconductor layer, and a high concentration first conductivity type semiconductor layer, and the width of the low concentration second conductivity type semiconductor layer is a width such that a reach-through of a depletion layer occurs at a clamping voltage.

6. A semiconductor device characterized by including at least a semiconductor element, and a protection diode formed across an insulating film on a semiconductor substrate on which the semiconductor element is formed, wherein one main electrode of the protection diode is connected to a high potential side main electrode of the semiconductor element, the other main electrode of the protection diode is connected to a gate electrode of the semiconductor element, the protection diode is configured of seven layers of bidirectional diode formed in contact in the order of a high concentration first conductivity type semiconductor layer, a medium concentration first conductivity type semiconductor layer, a low concentration second conductivity type semiconductor layer, a high concentration second conductivity type semiconductor layer, a low concentration second conductivity type semiconductor layer, a medium concentration first conductivity type semiconductor layer, and a high concentration first conductivity type semiconductor layer, and the width of the low concentration second conductivity type semiconductor layer is a width such that a reach-through of a depletion layer occurs at a clamping voltage.

7. The semiconductor device according to claim 5 or 6, characterized in that the other main electrode of the protection diode is connected to the gate electrode of the semiconductor element via a control circuit formed on the semiconductor substrate.

8. The semiconductor device according to claim 5 or 6, characterized in that the protection diode is formed of a multi-stage bidirectional diode formed of the seven layers of bidirectional diode connected in series.

9. The semiconductor device according to claim 8, characterized in that a main electrode in a place in which the seven layers of bidirectional diode are connected in series is removed.

10. The semiconductor device according to any one of claim 1, 2, 5 or 6, characterized in that the protection diode is formed of a polysilicon layer or a single crystal silicon layer.

11. The semiconductor device according to any one of claim 1, 2, 5 or 6, characterized in that when the low concentration second conductivity type semiconductor layer of the protection diode is formed of a low concentration p-type semiconductor layer, the width of the low concentration p-type semiconductor layer is 2 μm or less.

12. The semiconductor device according to any one of claim 1, 2, 5 or 6, characterized in that the semiconductor element is an IGBT or MOSFET, which are power MOS-type elements.

* * * * *